United States Patent
Nagai et al.

(10) Patent No.: US 7,460,410 B2
(45) Date of Patent: Dec. 2, 2008

(54) NONVOLATILE SEMICONDUCTOR MEMORY DEVICE AND PROGRAMMING OR ERASING METHOD THEREFOR

(75) Inventors: Hiroyasu Nagai, Osaka (JP); Masahiro Toki, Shiga (JP); Kenji Misumi, Kyoto (JP); Hideto Kotani, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/502,430

(22) Filed: Aug. 11, 2006

(65) Prior Publication Data

US 2007/0047318 A1 Mar. 1, 2007

(30) Foreign Application Priority Data

Sep. 1, 2005 (JP) .............................. 2005-253239

(51) Int. Cl.
  G11C 16/00 (2006.01)

(52) U.S. Cl. ............................ 365/185.28; 365/185.22; 365/185.29

(58) Field of Classification Search ............. 365/185.09
See application file for complete search history.

(56) References Cited

U.S. PATENT DOCUMENTS

| 5,365,486 | A | | 11/1994 | Schreck |
| 5,487,036 | A | * | 1/1996 | Akaogi et al. .......... 365/189.09 |
| 5,553,016 | A | * | 9/1996 | Takebuchi .................... 365/51 |
| 5,724,289 | A | * | 3/1998 | Watanabe ................... 365/201 |
| 5,754,471 | A | * | 5/1998 | Peng et al. ............... 365/185.1 |
| 5,774,400 | A | | 6/1998 | Lancaster et al. |
| 6,185,133 | B1 | * | 2/2001 | Chan et al. ............. 365/185.29 |
| 6,294,810 | B1 | * | 9/2001 | Li et al. ...................... 257/321 |
| 6,331,954 | B1 | * | 12/2001 | Wang et al. ............ 365/185.29 |
| 6,870,765 | B2 | | 3/2005 | Fujiwara |
| 2007/0165460 | A1 | * | 7/2007 | Toki et al. .............. 365/185.22 |

\* cited by examiner

*Primary Examiner*—Tan T. Nguyen
(74) *Attorney, Agent, or Firm*—McDermott Will & Emery LLP

(57) ABSTRACT

In a nonvolatile memory cell having a trap layer, programming or erasing is made in a sequence of first charge injection with a given wait time being secured and second charge injection executed after the first charge injection. Surrounding charge that deteriorates the data retention characteristic is reduced by use of initial variation occurring immediately after programming (charge loss phenomenon due to binding of injected charge with the surrounding charge in an extremely short time), and then the charge loss due to the initial variation is compensated, to thereby improve the data retention characteristic.

8 Claims, 20 Drawing Sheets

FIG. 3A
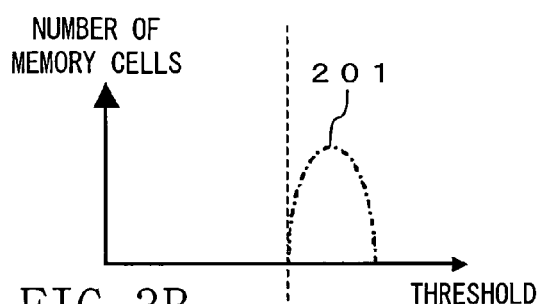
FIG. 3B
FIG. 3C
FIG. 3D
FIG. 3E
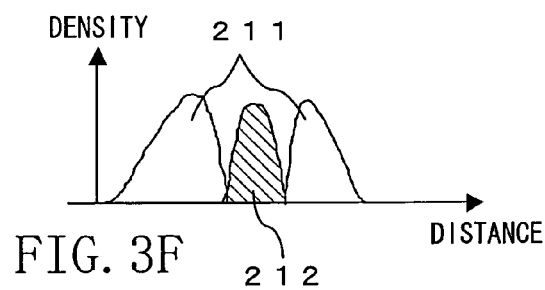
FIG. 3F
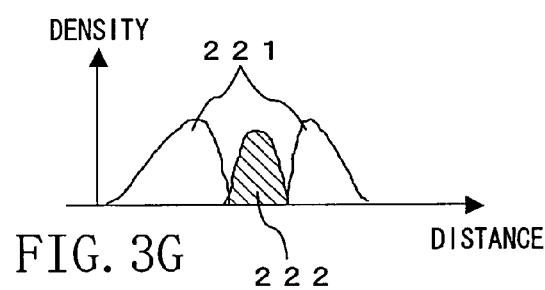
FIG. 3G
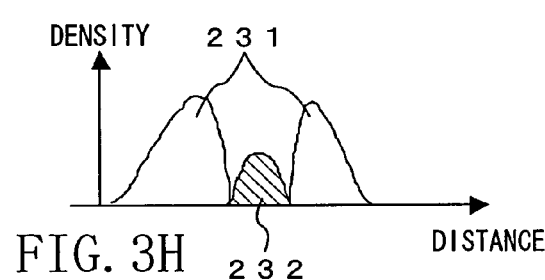
FIG. 3H
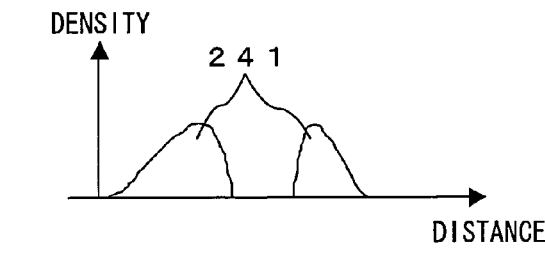

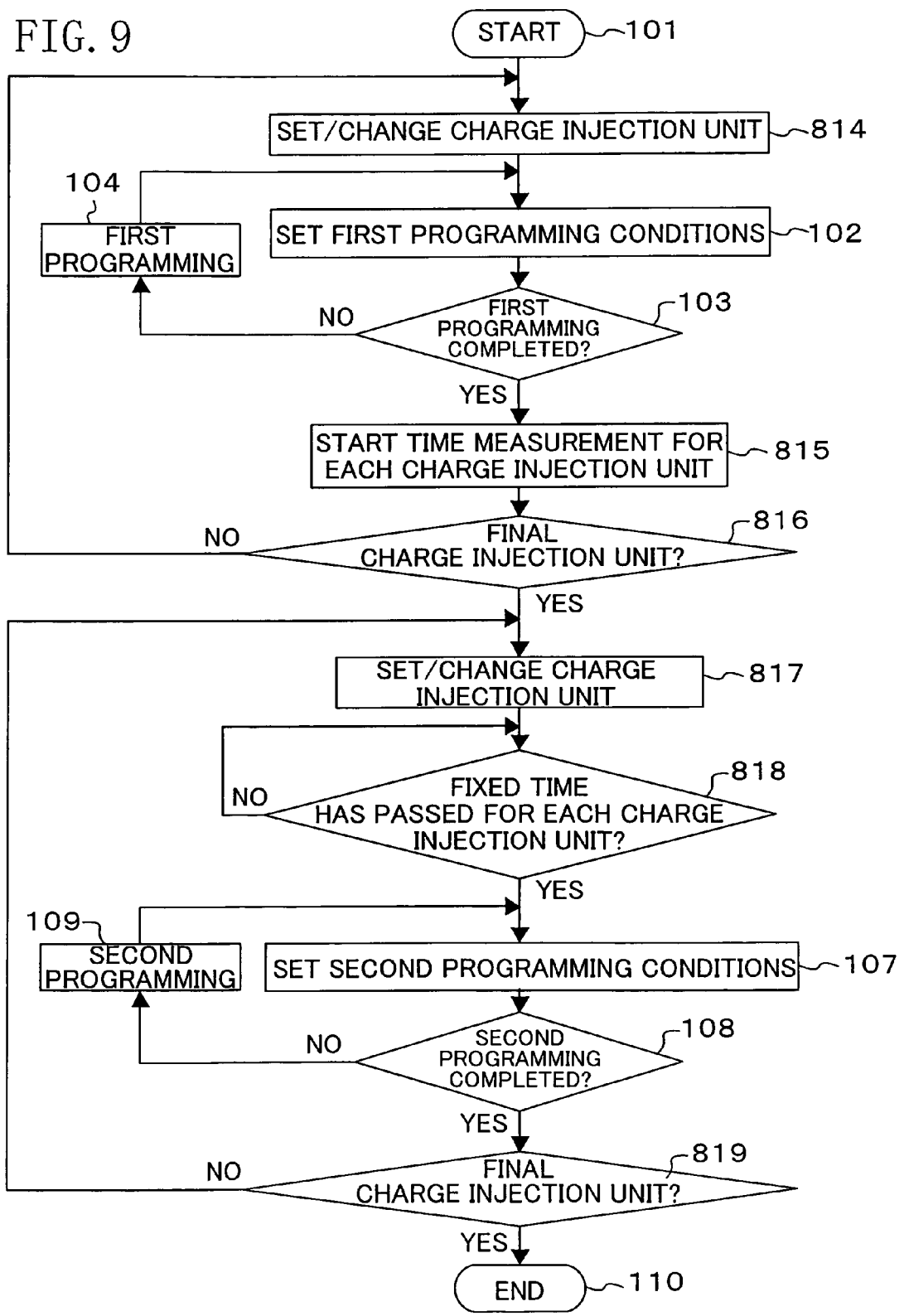

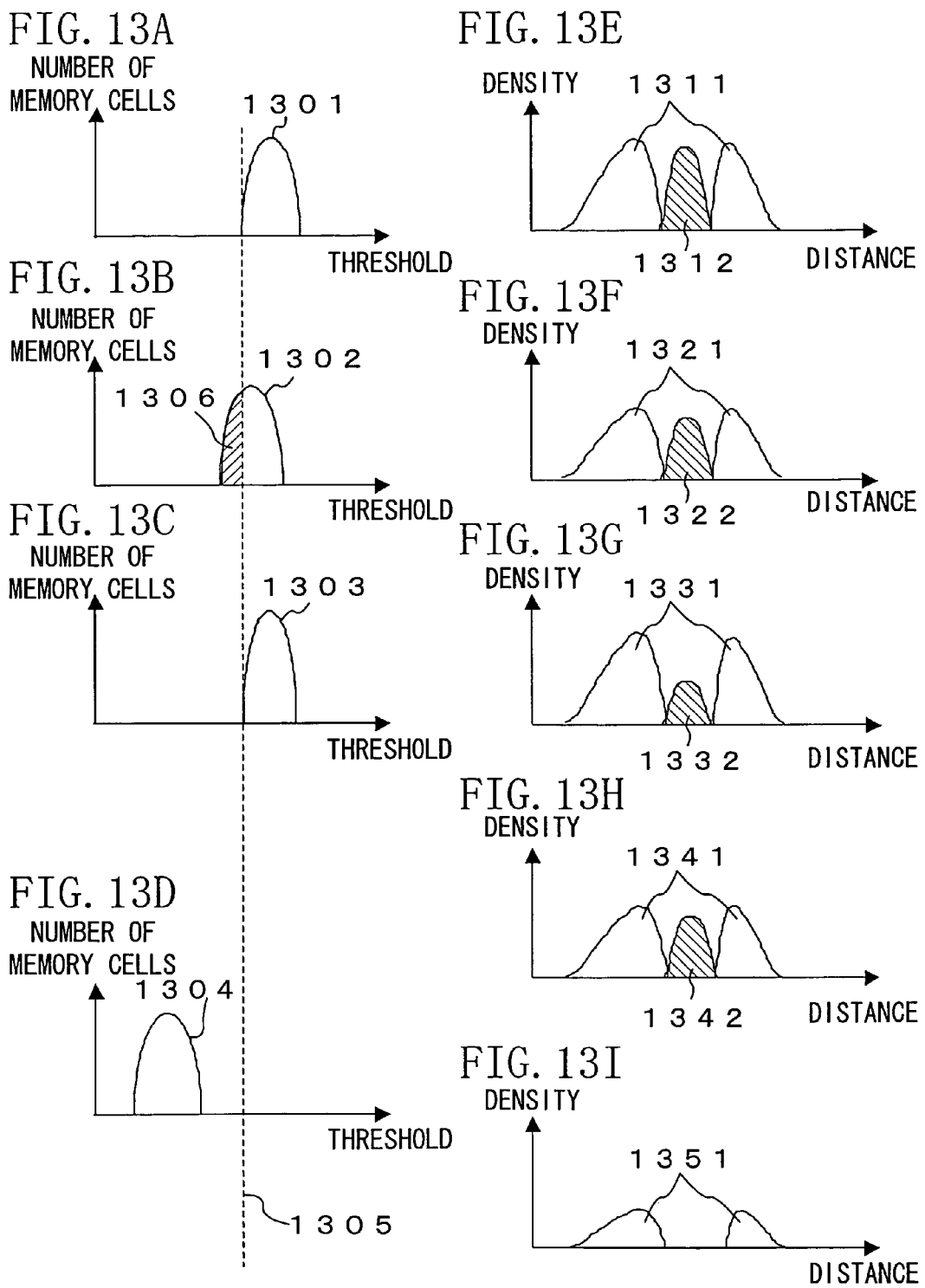

NONVOLATILE SEMICONDUCTOR MEMORY DEVICE AND PROGRAMMING OR ERASING METHOD THEREFOR

BACKGROUND OF THE INVENTION

The present invention relates to an electrically programmable, erasable nonvolatile semiconductor memory device having a trap layer in a gate insulation film formed between a channel region and a gate electrode of each memory cell transistor, and a programming or erasing method for such a semiconductor memory device.

In a conventional nonvolatile memory having a trap layer, electric charge (electrons and holes) is trapped by injection of the charge in a discrete trap layer (a SiN film or a transition region at the interface of a SiN film/a top $SiO_2$ film) existing inside an insulating film ($SiO_2$) formed between a channel region and a gate electrode of a memory cell. Data "0" or data "1" is determined with respect to the threshold voltage of the memory cell, to thereby store information.

Hereinafter, description will be made regarding injection of electrons as programming (write) while injection of holes as erasing, and also regarding injected charge and surrounding charge in programming (write) operation as electrons and holes respectively.

FIG. 19 is a schematic cross-sectional view of a nonvolatile memory having a trap layer, with the x-axis representing the channel direction. Using FIG. 19, the configuration and operation of the conventional nonvolatile memory having a trap layer will be described.

Referring to FIG. 19, the nonvolatile memory includes: a semiconductor substrate 1801 made of p-type silicon; a p-type channel region 1802 located above the semiconductor substrate 1801; a first impurity region 1803 made of n-type semiconductor located above the semiconductor substrate 1801 on one side of the channel region 1802; a second impurity region 1804 made of n-type semiconductor located above the semiconductor substrate 1801 on the other side of the channel region 1802; a bottom insulating film 1807 made of a silicon oxide film placed above the semiconductor substrate 1801; a trap layer made of a silicon nitride/oxide film placed on the bottom insulating film 1807; a top insulating film 1805 made of a silicon oxide film placed on the trap layer 1806; and a gate electrode 1808 made of n-type polysilicon placed on the top insulating film 1805.

In programming, about 9 V is applied to the gate electrode 1808, about 5 V to the first impurity region 1803, about 1 V to the second impurity region 1804 and 0 V to the semiconductor substrate 1801. With this voltage application, part of electrons moving from the second impurity region 1804 to the first impurity region 1803 is made hot with a high electric field in the neighborhood of the first impurity region 1803, and thus locally injected into the trap layer 1806. This turns the memory cell threshold voltage to a high state.

In erasing, about –3 V is applied to the gate electrode 1808, about 5 V to the first impurity region 1803, and 0 V to the semiconductor substrate 1801, while the second impurity region 1804 is put in a floating state. With this voltage application, part of holes generated due to inter-band tunneling inside the first impurity region 1803 is made hot with a high electric field in the neighborhood of the first impurity region 1803, and thus locally injected into the trap layer 1806. Thus turns the memory cell threshold voltage to a low state.

In reading, about 4 V is applied to the gate electrode 1808, 0 V to the first impurity region 1803, about 1.5 V to the second impurity region 1804, and 0 V to the semiconductor substrate 1801. With this voltage application, data "0" or "1" is obtained depending on existence/absence of charge in the trap layer 1806.

Next, referring to FIGS. 20A through 20E, the behavior of trapped charge in a non-biased state after programming in the conventional nonvolatile memory having a trap layer will be described.

FIGS. 20A and 20B show distributions of the memory cell threshold voltage, where the x-axis represents the memory cell threshold voltage and the y-axis represents the number of memory cells targeted for programming. FIGS. 20C through 20E show the probability density distributions in the neighborhood of the first impurity region 1803 in FIG. 19, where the x-axis represents the distance in the direction of arrow x in FIG. 19 and the y-axis represents the charge density.

FIG. 20A shows a distribution 1901 of the memory cell threshold voltage observed immediately after programming. FIG. 20B shows a distribution 1902 of the memory cell threshold voltage in the last period of life. The reference numeral 1903 denotes a verify level. FIG. 20C shows a probability density distribution 1911 of electrons injected under programming and a probability density distribution 1912 of holes injected under erasing preceding the programming. FIG. 20D shows a probability density distribution 1921 of electrons after binding with holes, and a probability density distribution 1922 of holes after binding with electrons. FIG. 20E shows a probability density distribution 1931 of electrons in the last period of life.

In the state in which two types of charge are locally trapped as described above, in the distribution 1901 of the memory cell threshold voltage observed immediately after programming, electrons and holes exhibit different probability density distributions 1911 and 1912 from each other as shown in FIG. 20C. At overlap portions of the probability density distributions 1911 and 1921 of electrons and of holes, electrons and holes are bound together instantaneously, to exhibit the probability density distribution 1921 of electrons and the probability density distribution 1922 of holes as shown in FIG. 20D. The binding between electrons and holes advances thereafter due to lateral charge diffusion, causing a change in memory cell threshold voltage.

In the distribution 1902 of the memory cell threshold voltage in the last period of life, since the total number of electrons is greater than that of holes in the programming state, holes disappear, and thus only the probability density distribution 1931 of electrons exists as shown in FIG. 20E. Thus, by reducing the total number of holes after programming, the data retention characteristic of memory cells can be improved.

According to U.S. Pat. No. 5,365,486, a memory cell of which the threshold voltage becomes too low due to a disturb to satisfy the verify level is programmed again, so that the verify level can be satisfied, and thus the memory cell threshold voltage can be suppressed from changing.

In the conventional nonvolatile memory having a trap layer, when charge is locally injected into the trap layer, the trapped charge diffuses in the lateral direction in a non-biased state and is bound with surrounding charge, causing a change in memory cell threshold voltage. The data retention characteristic deteriorates with this change in memory cell threshold voltage, and this causes lowering of the access speed and erroneous read of data in the market.

The data retention characteristic depends on the number of times of programming or erasing: as the number of times of programming or erasing is greater, the data retention characteristic deteriorates more greatly, blocking improvement in the guaranteed number of times of programming or erasing for products.

SUMMARY OF THE INVENTION

An object of the present invention is suppressing deterioration of the data retention characteristic of nonvolatile semiconductor memory cells having a trap layer.

To attain the above object, according to the present invention, in programming or erasing of a nonvolatile semiconductor memory device having a trap layer, charge injection is executed until reaching a given threshold voltage, a given wait time is then secured, and further charge injection is executed until reaching a given threshold voltage.

According to the present invention, in a programming or erasing sequence, first charge injection with a given wait time being secured and second charge injection following the first charge injection are executed. With this sequence, surrounding charge that may deteriorate the data retention characteristic is reduced by use of initial variation occurring immediately after the charge injection operation (charge loss phenomenon due to binding of the injected charge with the surrounding charge in an extremely short time), and then the charge loss due to the initial variation is compensated, to thereby improve the subsequent data retention characteristic.

BRIEF DESCRIPTION OF THE DRAWINGS

FIGS. 3A through 3H are views showing the behavior of trapped charge in the nonvolatile semiconductor memory device in Embodiment 1.

FIG. 9 is a view showing a programming or erasing sequence for the nonvolatile semiconductor memory device in Embodiment 3.

FIGS. 13A through 13I are views showing a programming or erasing method for a nonvolatile semiconductor memory device in Embodiment 7.

DESCRIPTION OF THE PREFERRED EMBODIMENTS

Hereinafter, preferred embodiments of the present invention will be described with reference to the accompanying drawings. Note that memory cells of the nonvolatile semiconductor memory devices in all the embodiments to be described hereinafter have a trap layer.

Note also that in the following description, the first charge injection is regarded as including first programming and wait time while the second charge injection is regarded as second programming.

Embodiment 1

Figure 1:
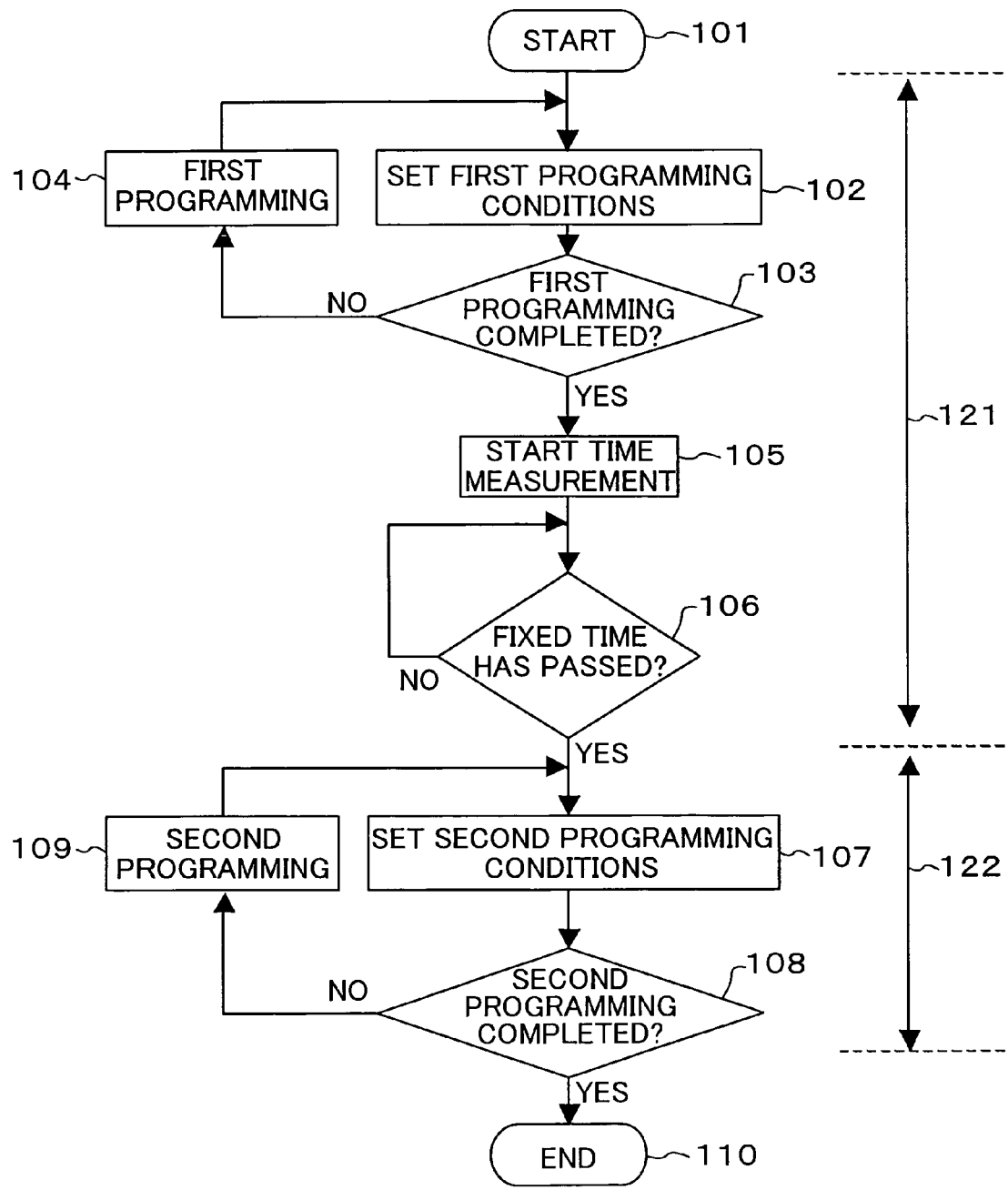
FIG. 1 is a view showing a programming or erasing method for a nonvolatile semiconductor memory device in Embodiment 1.

FIG. 1 is a flowchart showing a programming or erasing method for a nonvolatile semiconductor memory device in Embodiment 1 of the present invention. Hereinafter, a method adopted when programming is made for a particular nonvolatile memory cell will be described.

In the flowchart of FIG. 1, blocks 101 and 110 respectively represent start and end terminals, 102, 104, 105, 107 and 109 represent processing, 103, 106 and 108 represent decision, and 121 and 122 represent ranges.

The processing 102 is for setting conditions for executing the first programming, the processing 104 is for executing the first programming, and the processing 105 is for starting time measurement. The processing 107 is for setting conditions for executing the second programming, and the processing 109 is for executing the second programming. The decision 103 is for deciding whether or not the first programming has been completed, the decision 106 is for deciding whether or not a fixed time has passed, and the decision 108 is for deciding whether or not the second programming has been completed. The range 121 is for the first charge injection, and the range 122 is for the second charge injection.

The programming flow for a given memory cell, starting at the start terminal 101, goes to the processing 102 for setting desired first programming conditions and then to the decision 103 on whether or not the first programming has been completed. The processing 102 includes, for example, setting of the voltage condition, pulse width condition and the like in programming. The decision 103 includes, for example, programming verify of verifying that programming has been made until reaching a predetermined threshold voltage.

If it is decided in the decision 103 that the first programming has not been completed, the flow proceeds to the first programming processing 104. After execution of the first programming processing 104, the flow returns to the decision 103 on whether or not the first programming has been completed via the processing 102 for setting desired first programming conditions. The processing blocks 104 and 102 are repeated until completion of the first programming is verified in the decision 103.

If it is decided in the decision 103 that the first programming has been completed, the processing 105 of starting time measurement is executed, and the flow proceeds to the decision 106. In the decision 106, whether or not a fixed time has passed from the measurement is checked. If the fixed time has passed, the flow proceeds to the processing 107 of setting conditions for executing the second programming. If the fixed time has not passed, the decision 106 is repeated until the condition for the decision 106 is satisfied. A longer time is more desirable as the fixed time in the decision 106. The series of processing and decision described above fall in the range 121 of the first charge injection, which is composed of the first programming and the wait time determined by the fixed time. The subsequent series of processing and decision fall in the range 122 of the second charge injection.

After the processing 107 of setting conditions for executing the second programming, the flow proceeds to the decision 108 on whether or not the second programming has been completed. The processing 107 includes, for example, setting of the voltage condition, pulse width condition and the like in programming. The decision 108 includes, for example, verifying that a programming pulse has been applied a predetermined number of times.

If it is decided in the decision 108 that the second programming has not been completed, the flow proceeds to the second programming processing 109. After execution of the second programming processing 109, the flow returns to the decision 108 on whether or not the second programming has been completed via the processing 107 of setting desired second programming conditions. The processing blocks 109 and 107 are repeated until completion of the programming is determined in the decision 108. If it is determined in the decision 108 that the second programming has been completed, the flow proceeds to the end terminal 110 to terminate the series of programming operation.

The programming flow described above is also applicable to programming of a memory cell array by executing each of the processing blocks in programming units such as addresses.

Figure 2:
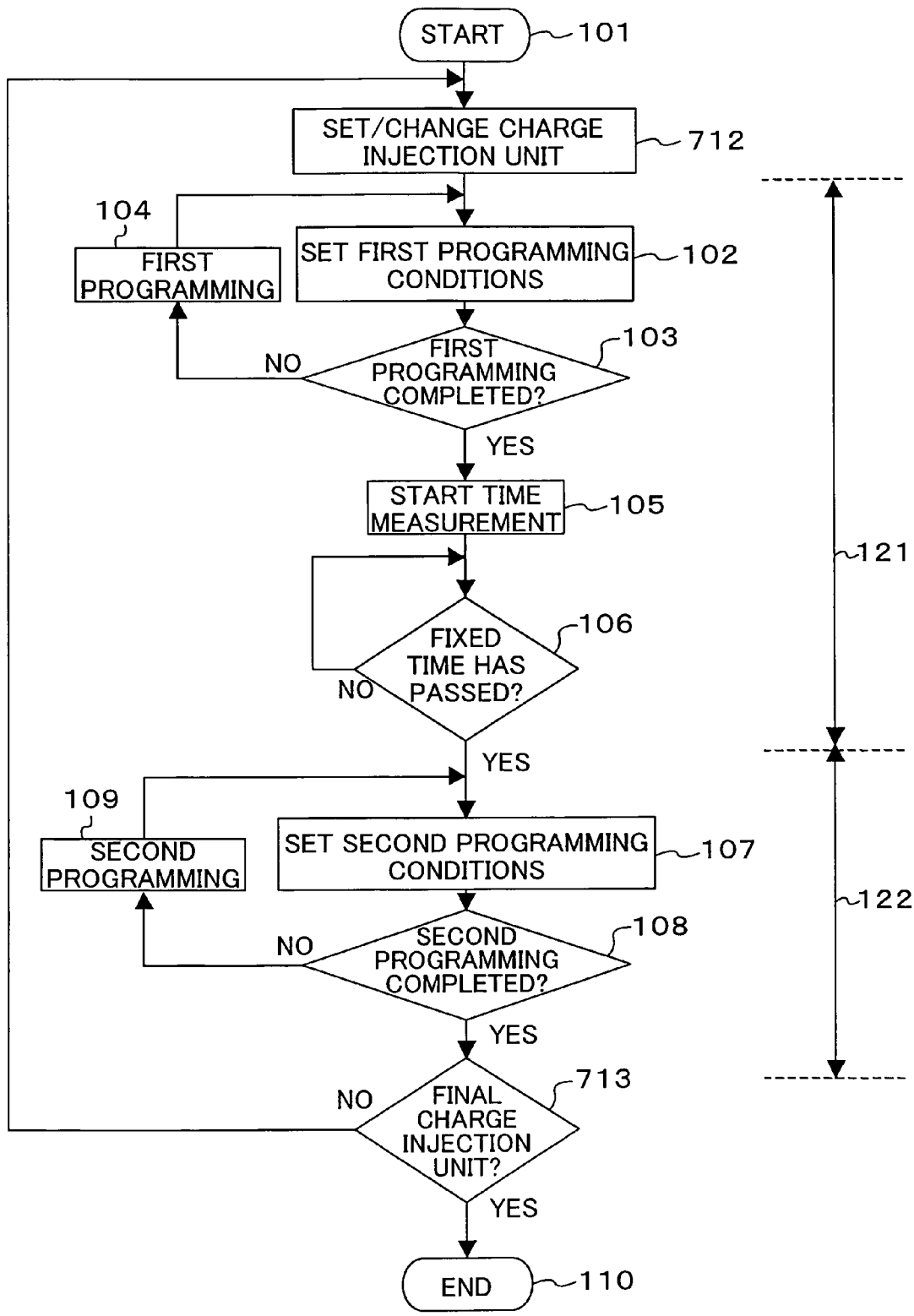
FIG. 2 is a view showing a programming or erasing method in programming units for the nonvolatile semiconductor memory device in Embodiment 1.

FIG. 2 is a flowchart of programming for a memory cell array. In the flowchart of FIG. 2, block 712 represents processing of setting or changing the programming unit, and 713 represents decision on whether or not the programming unit concerned is final in a predetermined programming area of the memory cell array.

Before execution of the first programming, the processing 712 of setting the programming unit for which the programming is to be executed is performed. The first and second programming operations are then executed in the manner described above. Once completion of the programming is determined in the decision 108 on whether or not the second programming has been completed, the decision 713 on whether or not the programming unit concerned is final in a predetermined programming area of the memory cell array is performed. If it is decided in the decision 713 that the programming unit is not final, the programming unit is changed in the processing 712 and then the first programming is executed. If it is decided in the decision 713 that the programming unit is final, the flow proceeds to the end terminal 110 to terminate the series of programming operation. Note herein that the programming unit refers to an address, for example, and the change of the programming unit refers to increment of the address, for example.

The behavior of charge in Embodiment 1 of the present invention will be described with reference to FIGS. 3A through 3H. FIGS. 3A through 3H show the behavior of trapped charge in a nonvolatile memory having a trap layer, which is observed when the programming flow shown in FIG. 1 is executed for a memory cell array.

Figure 19:
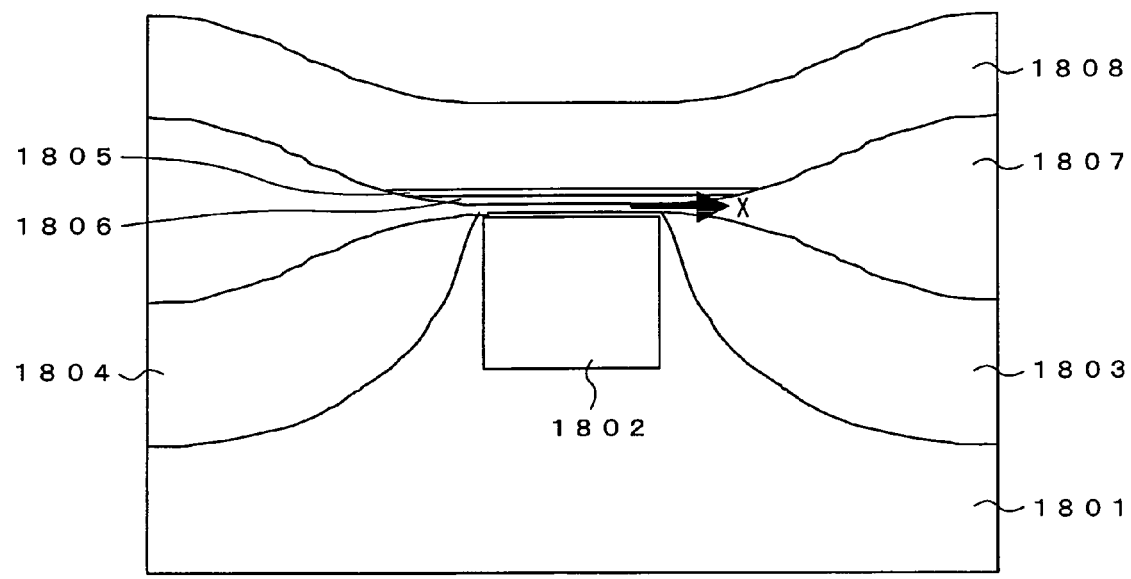
FIG. 19 is a view showing a memory cell structure of a conventional nonvolatile semiconductor memory device.
Figure 20A:
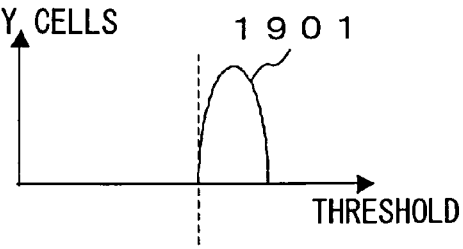
FIGS. 20A through 20E are views showing the behavior of trapped charge in the conventional nonvolatile semiconductor memory device.
Figure 20C:
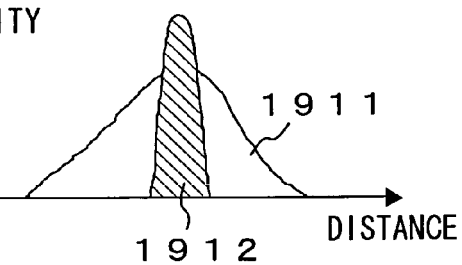
Figure 20B:
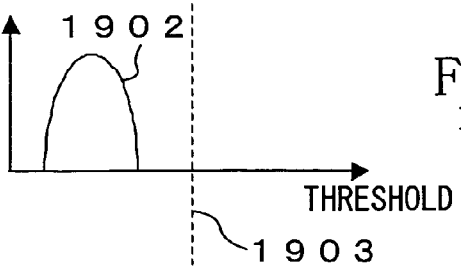
Figure 20D:
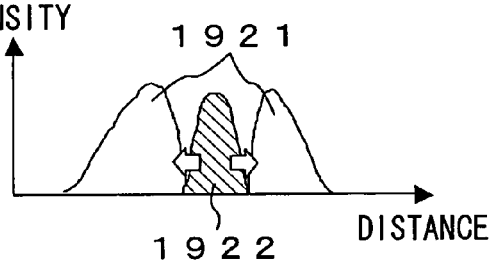
Figure 20E:
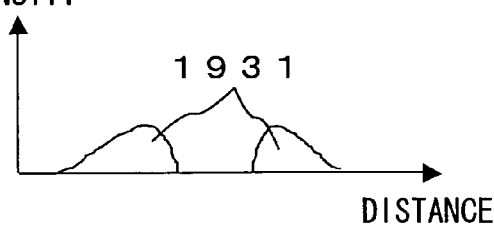

FIGS. 3A through 3D show distributions of the memory cell threshold voltage, where the x-axis represents the memory cell threshold voltage and the y-axis represents the number of memory cells targeted for programming. FIGS. 3E through 3H show the probability density distributions in the neighborhood of the first impurity region 1803 in a memory cell shown in FIG. 19, where the x-axis represents the distance in the direction of arrow x in FIG. 19 and the y-axis represents the charge density.

FIG. 3A shows a distribution 201 of the memory cell threshold voltage observed immediately after the first programming. FIG. 3B shows a distribution 202 of the memory cell threshold voltage observed after the lapse of a fixed time. FIG. 3C shows a distribution 203 of the memory cell threshold voltage observed immediately after execution of the second programming after the lapse of the fixed time. FIG. 3D shows a distribution 204 of the memory cell threshold voltage observed in the last period of life. In FIGS. 3A through 3D, 205 represents a programming verify level.

FIG. 3E shows a probability density distribution 211 of electrons injected under the first programming, and a probability density distribution 212 of holes injected under erasing preceding the first programming. FIG. 3F shows a probability density distribution 221 of electrons after binding with holes, and a probability density distribution 222 of holes after binding with electrons. FIG. 3G shows a probability density distribution 231 of electrons injected under the second programming after the binding with holes, and a probability density distribution 232 of holes after the binding with electrons. FIG. 3H shows a probability density distribution 241 of electrons in the last period of life.

In the distribution 201 of the memory cell threshold voltage observed immediately after the first programming, electrons and holes exhibit different probability density distributions from each other as shown in FIG. 3E. At their overlap portions, electrons and holes are bound together instantaneously. After the lapse of a fixed time from completion of the first programming, the probability density distribution 221 of electrons and the probability density distribution 222 of holes are as shown in FIG. 3F, and the distribution of the memory cell threshold voltage falls from 201 to 202.

Thereafter, once the second programming is executed, the distribution of the memory cell threshold voltage rises from 202 to the distribution 203 observed immediately after completion of the second programming as shown in FIG. 3C. At this time, electrons and holes exhibit the probability density distribution 231 of electrons and the probability density distribution 232 of holes as shown in FIG. 3G, in which the probability density of holes that deteriorate the data retention characteristic of the memory cell has decreased while the probability density of electrons has increased.

By adopting the manner described above, as an effect of the present invention, the subsequent binding between electrons and holes due to lateral diffusion of charge can be minimized compared with the conventional case shown in FIGS. 20A through 20E. This reduces the change in memory cell threshold voltage with time and improves the data retention characteristic of the memory cell. That is, in the distribution 204 of the memory cell threshold voltage observed in the last period of life as shown in FIG. 3D, the probability density distribution 241 of electrons is high as shown in FIG. 3H compared with the conventional probability density distribution 1931 of electrons shown in FIG. 20E.

Figure 4A:
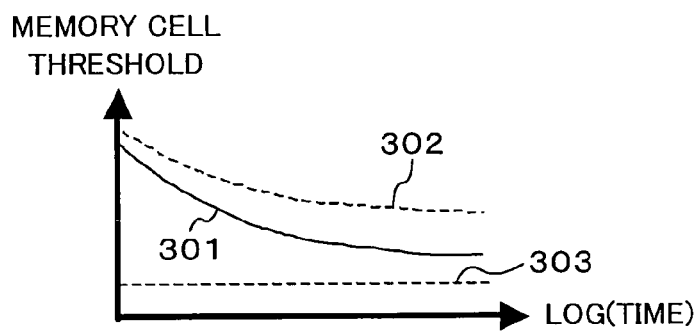
FIGS. 4A and 4B are views showing changes in the memory cell threshold voltage of the nonvolatile semiconductor memory device in Embodiment 1.
Figure 4B:
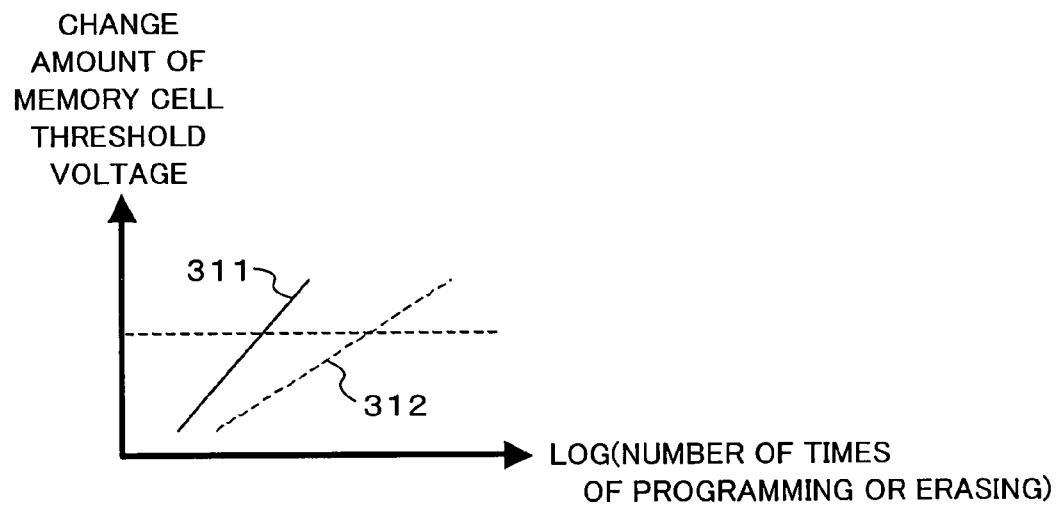

FIGS. 4A and 4B show changes in memory cell threshold voltage observed when the present invention is applied. In FIG. 4A, in which the x-axis represents the holding time and the y-axis represents the memory cell threshold voltage, lines 301 and 302 represent a change in memory cell threshold voltage in the conventional case and according to the present invention, respectively, and 303 represents the read level. The memory cell threshold voltage 302 according to the present invention is higher than the conventional memory cell threshold voltage 301 at every holding time. This indicates that a larger margin for data read can be secured and thus the data retention characteristic improves according to the present invention.

In FIG. 4B, in which the x-axis represents the number of times of programming or erasing and the y-axis represents the amount of change in memory cell threshold voltage, lines 311 and 312 represent the dependence of the threshold change amount on the number of times of programming or erasing in the conventional case and according to the present invention, respectively. According to the present invention, the number of times of programming or erasing giving the same amount of change in memory cell threshold voltage is large compared with the conventional case.

Figure 5:
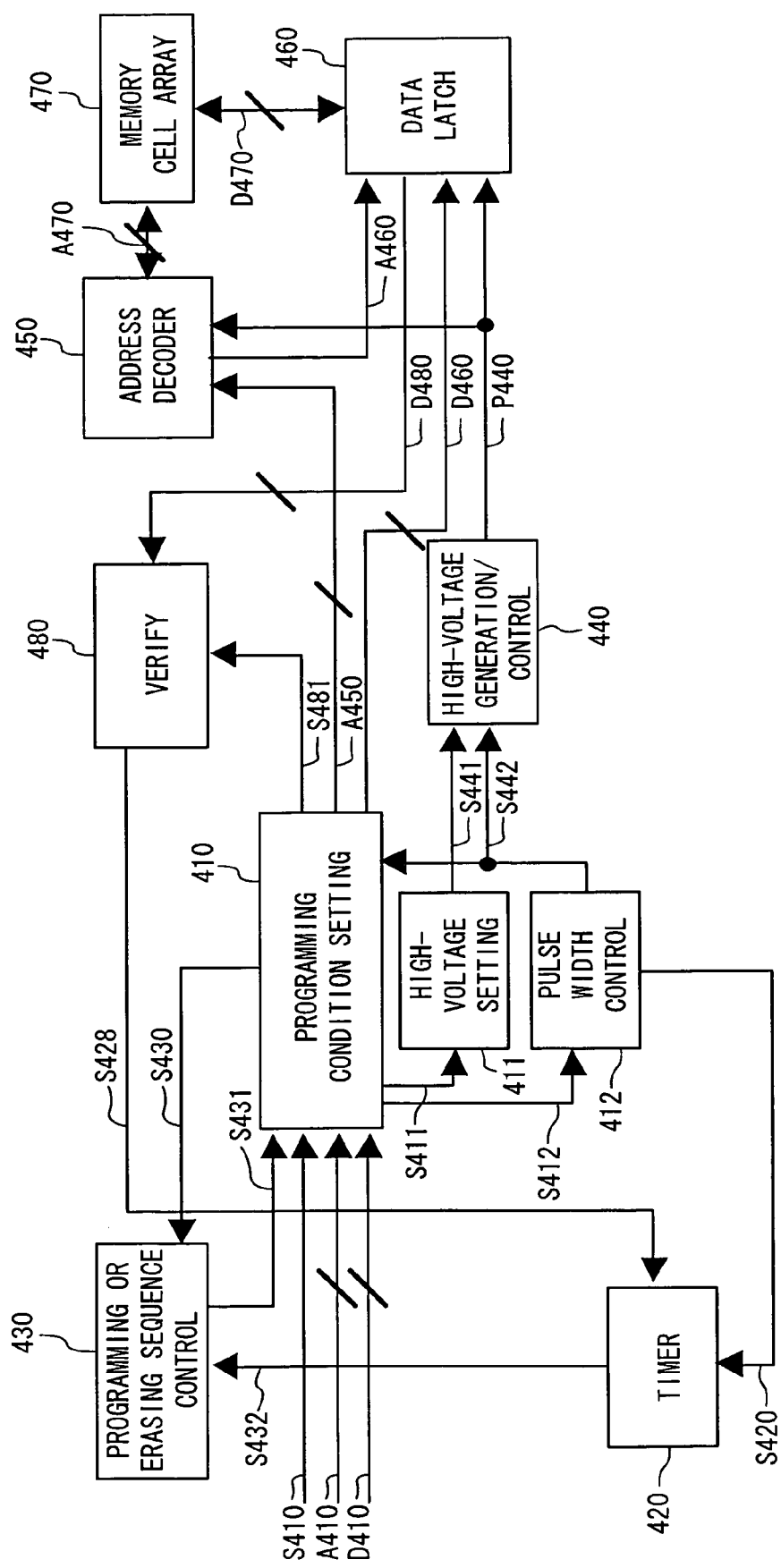
FIG. 5 is a view showing a circuit configuration of the nonvolatile semiconductor memory device in Embodiment 1.

This embodiment can be implemented with the configuration of FIG. 5. FIG. 5 shows a nonvolatile semiconductor memory device in Embodiment 1 of the present invention. Referring to FIG. 5, a method adopted when programming is made for a nonvolatile memory cell at a predetermined address will be described.

The nonvolatile semiconductor memory device of FIG. 5 includes a programming condition setting circuit 410, a high-voltage setting circuit 411, a pulse width control circuit 412, a timer circuit 420, a programming or erasing sequence control circuit 430, a high-voltage generation/control circuit 440, an address decoder circuit 450, a data latch circuit 460, a memory cell array 470 and a verify circuit 480.

In FIG. 5, also shown are control signals S410 to S412, S420, S428, S430 to S432, S441, S442 and S481, address buses A410, A450, A460 and A470, data buses D410, D460 D470 and D480 and a high-voltage signal P440.

First, the first programming operation will be described. The programming condition setting circuit 410 receives the control signal S410, the programming address A410 and the programming data D410 input externally and sets first programming conditions. Note herein that the control signal is a programming command or the like, and the programming conditions include the voltage condition, the pulse width condition and the like in programming. According to the input set conditions, the voltage condition and the pulse width condition are set in or controlled with the high-voltage setting circuit 411 and the pulse width control circuit 412, respectively. The high voltage required for programming is controlled with the high-voltage generation/control circuit 440 based on the set value in the high-voltage setting circuit 411, and is output as the high-voltage signal P440. The high-voltage signal P440 is input into the address decoder circuit 450 and the data latch circuit 460, to be applied to a memory cell in the memory cell array 470 selected by the address decoder circuit 450 based on data from the data latch circuit 460 for the time period set in the pulse width control circuit 412.

Termination of the programming is decided under programming verify of verifying that the programming has been made until reaching a predetermined threshold level, which is performed by the verify circuit 480.

If it is decided under the programming verify that the first programming has not yet been completed, the first programming pulse is applied. After the application of the first programming pulse, desired first programming conditions are set and then the programming verify on whether or not the first programming has been completed is performed. The application of the first programming pulse is repeated until completion of the programming is decided under the programming verify.

If completion of the programming is decided under programming verify, time measurement is started with input of the output signal S428 from the verify circuit 480 into the timer circuit 420. After the lapse of a fixed time, the control signal S432 is input into the programming or erasing sequence control circuit 430, to proceed to the second programming operation.

Alternatively, in the case of a programming flow involving no verify operation, time measurement is started with input of the output signal S420 from the pulse width control circuit 412, indicating timing of termination of the pulse application, into the timer circuit 420. After the lapse of a fixed time, the control signal S432 is input into the programming or erasing sequence control circuit 430, to proceed to the second programming operation.

Next, the second programming operation will be described. The programming condition setting circuit 410 starts the second programming operation with the control signal S431 sent from the programming or erasing sequence control circuit 430, and sets second programming conditions. The programming conditions include the voltage condition, the pulse width condition and the like in programming, for example. According to the input set conditions, the voltage condition and the pulse width condition are set in or controlled with the high-voltage setting circuit 411 and the pulse width control circuit 412, respectively. The high voltage required for programming is controlled with the high-voltage generation/control circuit 440 based on the set value in the high-voltage setting circuit 411, and is output as the high-voltage signal P440. The high-voltage signal P440 is input into the address decoder circuit 450 and the data latch circuit 460, to be applied to a memory cell in the memory cell array 470 selected by the address decoder circuit 450 based on data from the data latch circuit 460 for the time period set in the pulse width control circuit 412. Termination of the programming is decided under programming verify of verifying that the programming has been made until reaching a predetermined threshold level, which is performed by the verify circuit 480.

If it is decided under the programming verify that the second programming has not yet been completed, the second programming pulse is applied. After the application of the second programming pulse, desired second programming conditions are set and then the programming verify on whether or not the second programming has been completed is performed. The application of the second programming pulse is repeated until completion of the programming is decided under the programming verify.

If completion of the programming is decided under programming verify, the series of programming operation is terminated.

As described above, according to the present invention, using the initial variation as a charge loss phenomenon due to binding of injected charge with surrounding charge in an extremely short time immediately after the charge injection, the surrounding charge that deteriorates the data detention characteristic is reduced. The charge loss due to the initial variation is then compensated, to thereby improve the subsequent data retention characteristic.

Embodiment 2

Figure 6:
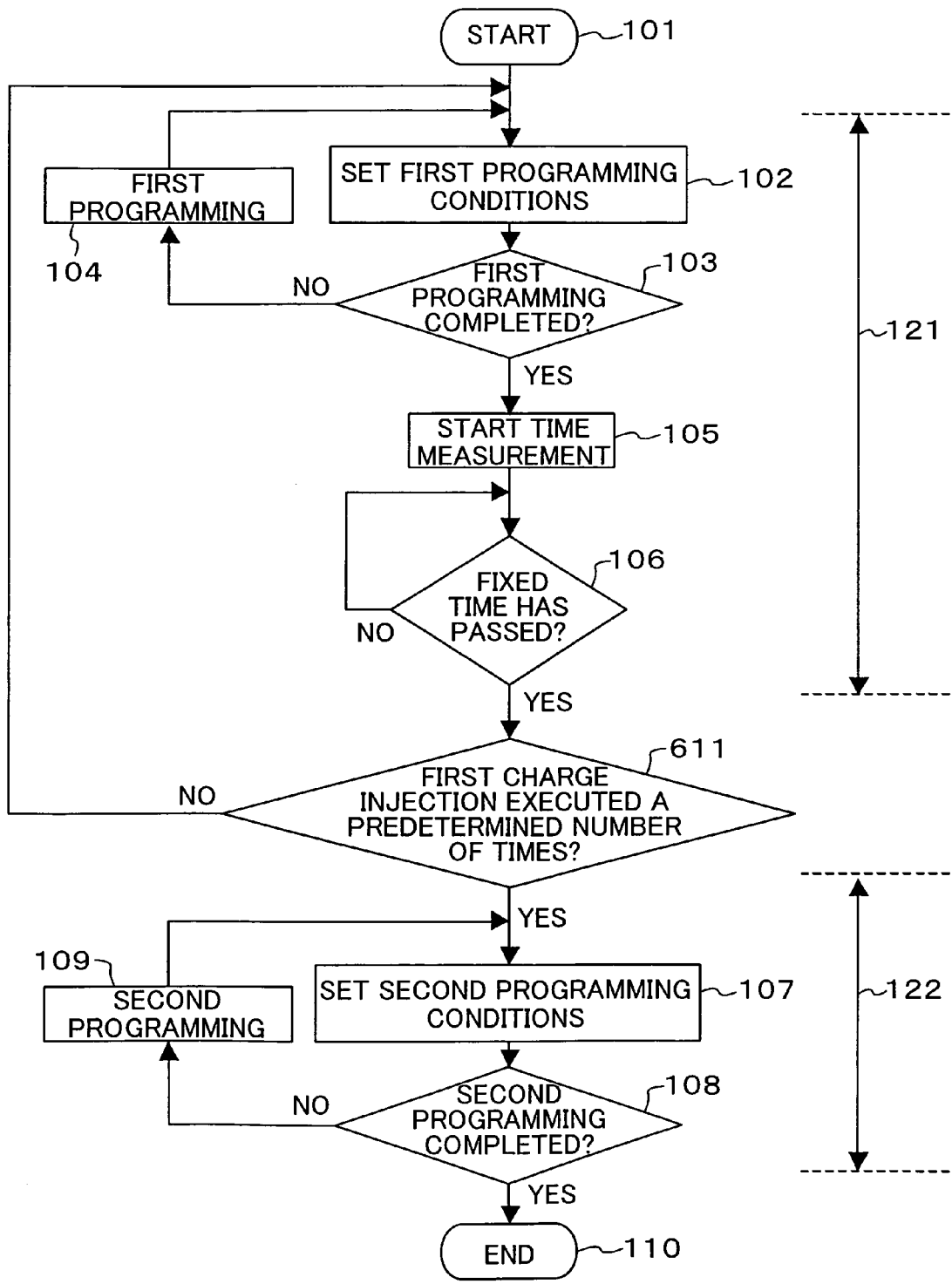
FIG. 6 is a view showing a programming or erasing method for a nonvolatile semiconductor memory device in Embodiment 2.

FIG. 6 is a flowchart showing a programming or erasing method for a nonvolatile semiconductor memory device in Embodiment 2 of the present invention. Hereinafter, a method adopted when programming is made for a particular nonvolatile memory cell will be described.

In the flowchart of FIG. 6, a block 611 is for deciding whether or not the first charge injection has been executed a predetermined number of times.

Once completion of the first programming is decided in the decision 103, the processing 105 of starting time measurement is executed. Whether or not a fixed time has passed from the start of time measurement is determined in the decision 106. If the fixed time has passed, then the flow proceeds to the decision 611 of determining whether or not the first charge injection has been executed a predetermined number of times. If it is determined in the decision 611 that the first charge injection has been executed a predetermined number of times, the flow proceeds to the processing 107 of setting conditions for executing the second programming, to execute the second programming. If it is determined in the decision 611 that the first programming has not been executed a predetermined number of times, the flow returns to the processing 102 of setting conditions for executing the first programming, to execute the first programming. A larger predetermined number of times is more desirable.

Figure 7:
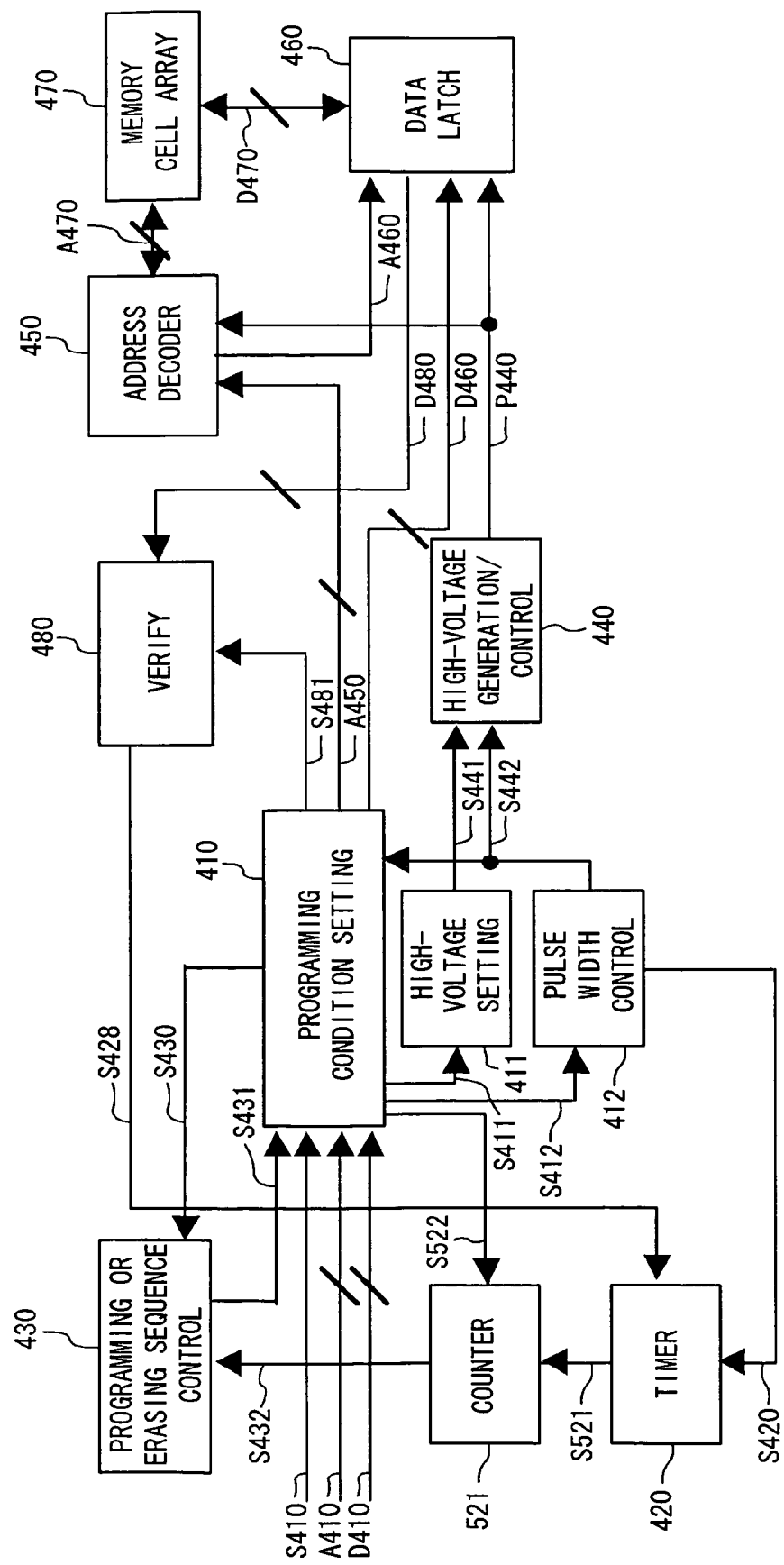
FIG. 7 is a view showing a circuit configuration of the nonvolatile semiconductor memory device in Embodiment 2.

This embodiment can be implemented with the configuration of FIG. 7. FIG. 7 shows a nonvolatile semiconductor memory device in Embodiment 2 of the present invention. Hereinafter, a method adopted when programming is made for a nonvolatile memory cell at a particular address will be described.

The configuration of FIG. 7 is the same as that of FIG. 5 except that a counter circuit 521 is connected between an output signal S521 from the timer circuit 420 and the input signal S432 into the programming or erasing sequence control circuit 430 and that an output signal S522 from the programming condition setting circuit 410 is input into the counter circuit 521.

If completion of the first programming is decided under programming verify, the timer circuit 420 starts time measurement. After the lapse of a fixed time, the output signal S521 from the timer circuit 420 is input into the counter circuit 521. If it is determined with the output signal S521 that the first programming has been executed the number of times set with the output signal S522 from the programming condition setting circuit 410, the control signal S432 is input into the programming or erasing sequence control circuit 430, to proceed to the second programming operation. If it is determined in the counter circuit 521 that the first programming has not been executed the set number of times, conditions for executing the first programming are set, to execute the first programming.

By repeating executing the first programming and giving a fixed time to allow electrons and holes to be bound together, there are provided advantages of further improving the data retention characteristic and moreover narrowing the range of distribution of the memory cell threshold voltage.

The second programming can be executed for all the memory cells subjected to the first programming. In this case, the effect of the present invention is given to all the memory cells uniformly, and thus a significantly high effect can be obtained for the data retention of the memory cell array.

Alternatively, the second programming can be executed for part of the memory cells subjected to the first programming. In this case, the present invention is applied to only part of the memory cells, such as those especially high in the degree of deteriorating the data retention life. Thus, while the effect as the chip is maintained, the present invention can be executed in a shorter time since the second programming is not executed for non-targeted memory cells.

Embodiment 3

Figure 8A:
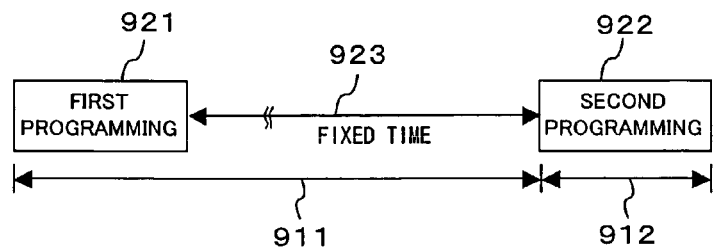
FIGS. 8A and 8B are views showing a programming or erasing method for a nonvolatile semiconductor memory device in Embodiment 3.

FIG. 8A shows an execution sequence in Embodiment 3 of the present invention. Referring to FIG. 8A, a fixed time 923 is secured from completion of first programming 921 until start of second programming 922. Note that the first charge injection corresponds to a range 911 including the first programming 921 and the fixed time 923 and the second charge injection corresponds to a range 912 including the second programming 922. A longer fixed time 923 is more desirable. In particular, the fixed time 923 may be a time longer than the time required for normal verify operation or read operation, or a time in which electrons trapped under the first programming have been bound with surrounding charge (holes) already trapped before the first programming.

In programming for a memory cell array, however, if the sequence of FIG. 8A is executed serially for a plurality of addresses, the time required for programming will disadvantageously increase. In Embodiment 3, this problem can be solved in the following manner.

Figure 8B:
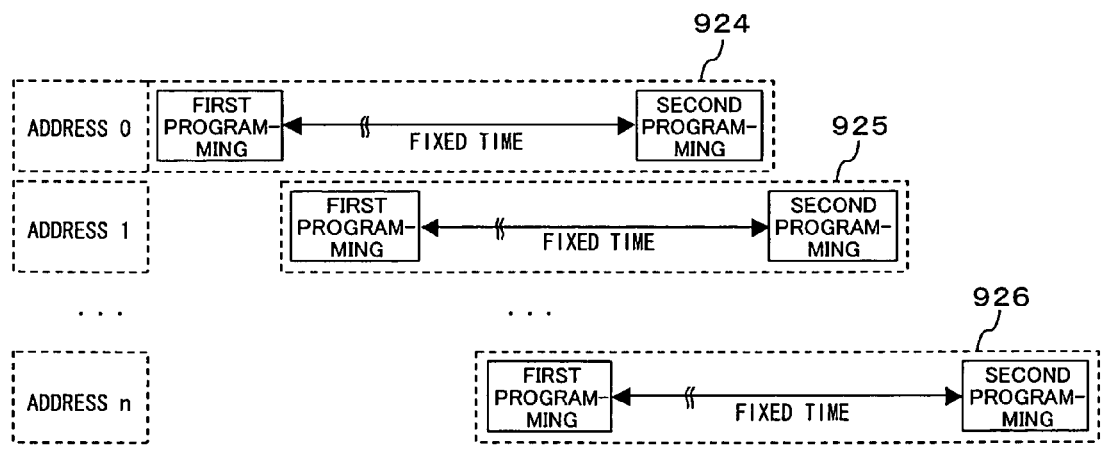

FIG. 8B shows an example of execution sequence in a programming or erasing method for a nonvolatile semiconductor memory device in Embodiment 3 of the present invention. In FIG. 8B, shown are a programming execution sequence 924 for the first address 0, a programming execution sequence 925 for the next address 1, and a programming execution sequence 924 for the n-th address n. These sequences are the same as the execution sequence of FIG. 8A.

In programming of a memory cell array having a plurality of (n) addresses, the programming execution sequence 924 for the first address 0, the programming execution sequence 925 for the next address 1 and so on are sequentially executed until the programming execution sequence 926 for the last address n.

In the above execution, after completion of the first programming for the first address 0, the first programming for the next address 1 is executed. In this way, after completion of the first programming for any address, the first programming for the next address is executed sequentially until the first programming for the last address n. After completion of the first programming for the last address n, by which the fixed time to be secured from the completion of the first programming until start of the second programming for the first address 0 has passed with the execution of the first programming for the plurality of addresses, the second programming for the first address 0 can be executed. The second programming is then sequentially executed for the subsequent addresses.

FIG. 9 is a flowchart showing a programming or erasing method for a nonvolatile semiconductor memory device in Embodiment 3 of the present invention. The flowchart of FIG. 9 additionally includes blocks 814, 815 and 817 for processing and blocks 816, 818 and 819 for decision.

Referring to FIG. 9, the block 815 represent processing of starting time measurement for each programming unit, and the blocks 814 and 817 represent processing of setting or changing the programming unit in the first programming and the second programming, respectively. The blocks 816 and 819 represent decision on whether or not the programming unit concerned is final in a predetermined programming area of the memory cell array in the first programming and the second programming, respectively. The block 818 is decision on whether or not a fixed time has passed for each programming unit.

The programming flow for a predetermined memory cell array starts at the start terminal 101. The programming unit is set in the processing 814 before the first programming is executed. The flow proceeds to the processing 102 of setting desired first programming conditions, and then to the decision 103 on whether or not the first programming has been completed. If it is determined in the decision 103 that the first programming has not been completed, the flow proceeds to the first programming processing 104. After execution of the first programming processing 104, the flow returns to the decision 103 on whether or not the first programming has been completed via the processing 102 of setting desired first programming conditions. The processing blocks 104 and 102 are repeated until completion of the programming is determined in the decision 103.

If completion of the programming is determined in the decision 103, the processing 815 of starting time measurement for each programming unit is executed. Note that in the case of the sequence discussed with reference to FIG. 8B, the processing 815 marks the start point of the measurement of the fixed time for each address.

After completion of the processing 815, the flow proceeds to the decision 816 on whether or not the programming unit concerned is final in a predetermined programming area of the memory cell array. If the programming unit is not final in the decision 816, the processing 814 of changing the programming unit is performed, and then the flow proceeds to the processing 102 of setting desired first programming conditions. If the programming unit is final in the decision 816, the flow proceeds to the processing 817 to set the programming unit before execution of the second programming.

In the decision 816, in the case of the sequence in FIG. 8B, if the address for which the first programming has been completed is the first address 0, the flow proceeds to the programming for the next address 1. If the address is the final address n, the flow proceeds to the processing 817.

After the execution of the processing 817, the flow proceeds to the decision 818 on whether or not a fixed time has passed for each programming unit. In the decision 818, whether or not a fixed time has passed from the processing 815 of starting time measurement for each programming unit is determined for the programming unit for which the second programming is to be executed. If the fixed time has passed, the flow proceeds to the processing 107 of setting conditions for executing the second programming. If the fixed time has not been passed, the decision 818 is repeated until the condition of the decision 818 is satisfied. In the case of the sequence in FIG. 8B, satisfying the condition of the decision 818 means that the fixed time for each address has passed.

After the processing 107 of setting conditions for executing the second programming, flow proceeds to the decision 108 on whether or not the second programming has been completed. If it is decided in the decision 108 that the second programming has not been completed, the flow proceeds to the second programming processing 109. After execution of the second programming processing 109, the flow returns to the decision 108 on whether or not the second programming has been completed via the processing 107 of setting desired second programming conditions. The processing blocks 109 and 107 are repeated until completion of the programming is determined in the decision 108. If it is decided in the decision 108 that the programming has been completed, the flow proceeds to the decision 819 on whether or not the programming unit concerned is final in a predetermined programming area of the memory cell array. If it is determined in the decision 819 that the programming unit is not final, the programming unit is changed in the processing 817, and then the flow proceeds to the decision 818 on whether or not the fixed time has passed for each programming unit. If it is determined in the decision 819 that the programming unit is final, the flow proceeds to the end terminal 110 to terminate the programming flow.

In the case of the sequence shown in FIG. 8B, if the address for which the second programming has been completed is the first address 0, the flow proceeds to the programming for the next address 1. If the address is the final address n, the flow proceeds to the end terminal 110.

As described above, operation other than the programming operation for a predetermined memory cell, such as the first programming for a different address, can be executed during the interval between the first programming and the second programming for the predetermined memory cell. This can minimize the increase of the programming time while permitting application of the present invention.

If the capacity of a programming or erasing region of the memory cell array is different from that of another programming or erasing region, the time from completion of the first programming until start of the second programming will differ with the difference in capacity. In this case, by using a timer circuit and the like to manage the time from completion of the first programming until start of the second programming, the effect can be made uniform over a plurality of different programming or erasing regions.

Embodiment 4

In Embodiment 4, both the first programming and the second programming are executed under given conditions without verify operation. In such programming under given conditions, programming is performed with the programming or erasing voltage and the pulse width being fixed, for example.

FIGS. 10A through 10H show a programming or erasing method for a nonvolatile semiconductor memory device in Embodiment 4 of the present invention. Hereinafter, a method adopted when programming is made for a particular nonvolatile memory cell will be described.

FIGS. 10A through 10D show distributions of the memory cell threshold voltage, where the x-axis represents the memory cell threshold voltage and the y-axis represents the number of memory cells targeted for programming. FIGS. 10E through 10H show the probability density distributions in the neighborhood of the first impurity region 1803 in FIG. 19, where the x-axis represents the distance in the direction of arrow x in FIG. 19 and the y-axis represents the charge density.

Figure 10A:
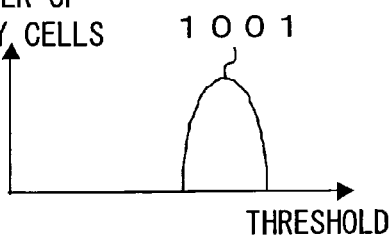
FIGS. 10A through 10H are views showing a programming or erasing method for a nonvolatile semiconductor memory device in Embodiment 4.
Figure 10B:
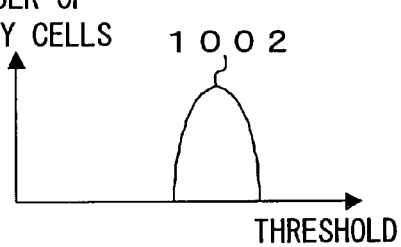
Figure 10C:
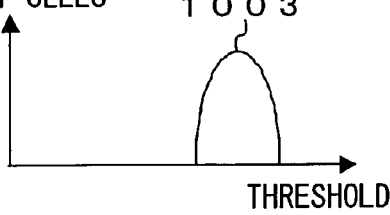
Figure 10D:
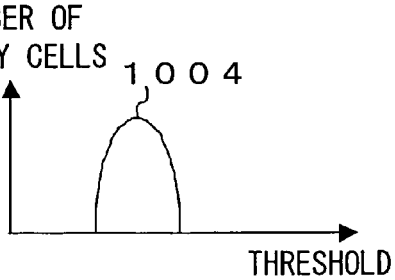
Figure 10E:
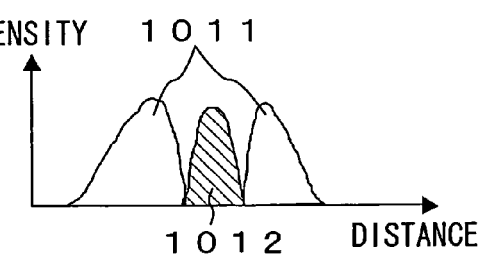
Figure 10F:
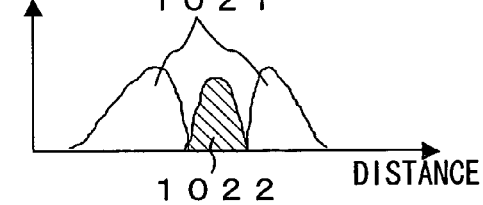
Figure 10G:
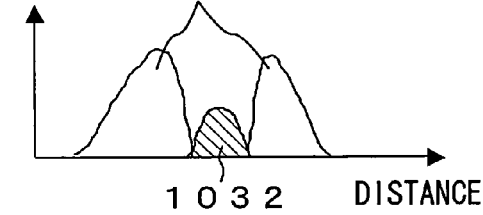
Figure 10H:
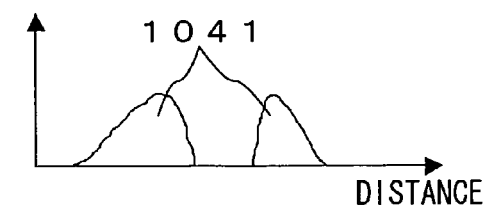

FIG. 10A shows a distribution 1001 of the memory cell threshold voltage observed immediately after the first programming under given conditions. FIG. 10B shows a distribution 1002 of the memory cell threshold voltage observed after the lapse of a fixed time. FIG. 10C shows a distribution 1003 of the memory cell threshold voltage observed after the second programming under given conditions. FIG. 10D shows a distribution 1004 of the memory cell threshold voltage observed in the last period of life. FIG. 10E shows a probability density distribution 1011 of electrons and a probability density distribution 1012 of holes, both observed immediately after the first programming under given conditions. FIG. 10F shows a probability density distribution 1021 of electrons and a probability density distribution 1022 of holes, both observed after the lapse of a fixed time. FIG. 10G shows a probability density distribution 1031 of electrons and a probability density distribution 1032 of holes, both observed after the second programming under given conditions. FIG. 10H shows a probability density distribution 1041 of electrons in the last period of life.

In the state in which two types of charge are locally trapped as described above, in the distribution 1001 of the memory cell threshold voltage observed immediately after the first programming under given conditions, electrons and holes exhibit different probability density distributions from each other. At their overlap portions, electrons and holes bind together instantaneously, to exhibit the probability density distribution 1011 of electrons and the probability density distribution 1012 of holes as shown in FIG. 10E. Note that as the memory cell threshold voltage 1001 after the first programming is lower, the probability density distribution 1011 of electrons is smaller while the probability density distribution 1012 of holes is greater, and thus the effect of improving the data retention characteristic decreases.

In the distribution 1002 of the memory cell threshold voltage observed after a fixed time, binding between electrons and holes advances due to lateral diffusion of charge. This results in reduction in the numbers of electrons and holes, to exhibit the probability density distribution 1021 of electrons and the probability density distribution 1022 of holes as shown in FIG. 10F. This causes a change in memory cell threshold voltage, that is, the distribution of the memory cell threshold voltage falls from the distribution 1001.

In the distribution 1003 of the memory cell threshold voltage observed after the second programming under given conditions, since no verify operation is executed, electrons are newly injected for all memory cells. This increases the number of electrons while decreasing the number of holes, to exhibit the probability density distribution 1031 of electrons and the probability density distribution 1032 of holes as shown in FIG. 10G. This causes a change in memory cell threshold voltage, that is, the distribution of the memory cell threshold voltage rises from the distribution 1002. In this way, since the charge loss due to the initial variation is compensated for all memory cells, the effect of improving the data retention characteristic of memory cells is great.

In the distribution 1004 of the memory cell threshold voltage in the last period of life, since the total number of electrons is greater than that of holes in the programming state, holes disappear by binding with electrons, and thus only the probability density distribution 1041 of electrons exists as shown in FIG. 10H. This causes a change in memory cell threshold voltage, that is, the distribution of the memory cell threshold voltage falls from the distribution 1003. Note that as the probability density distribution 1032 of holes after the second programming is smaller, the effect of improving the data retention characteristic of memory cells increases.

Thus, according to the present invention, since no verify operation is executed for both the first and second programming, the programming time can be shortened. In addition, since no verify operation is executed for the second programming, the charge loss due to the initial variation can be compensated for all memory cells.

Embodiment 5

In Embodiment 5, while the first programming is executed under given conditions without verify operation, the second programming is executed with verify operation. By executing verify operation, the memory cell threshold voltages after the programming operation can be aligned with the verify level.

FIGS. 11A through 11I are views showing a programming or erasing method for a nonvolatile semiconductor memory device in Embodiment 5 of the present invention. Hereinafter, a method adopted when programming is made for a particular nonvolatile memory cell will be described.

FIGS. 11A through 11D show distributions of the memory cell threshold voltage, where the x-axis represents the memory cell threshold voltage and the y-axis represents the number of memory cells targeted for programming. FIGS. 11E through 11I show the probability density distributions in the neighborhood of the first impurity region 1803 in FIG. 19, where the x-axis represents the distance in the direction of arrow x in FIG. 19 and the y-axis represents the charge density.

Figure 11A:
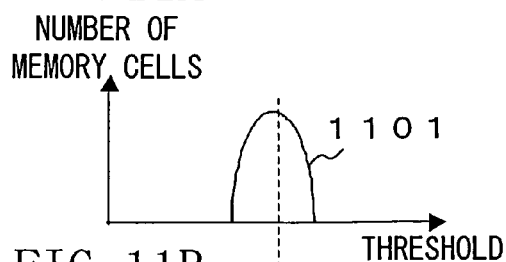
FIGS. 11A through 11I are views showing a programming or erasing method for a nonvolatile semiconductor memory device in Embodiment 5.
Figure 11B:
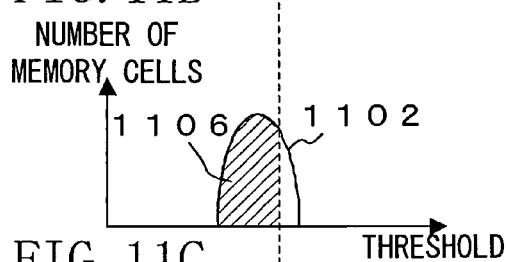
Figure 11C:
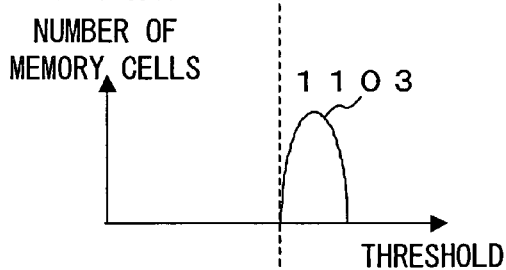
Figure 11D:
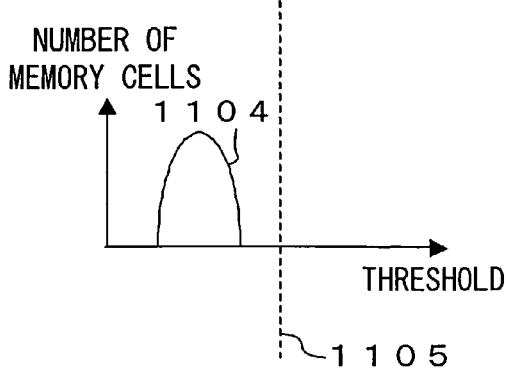
Figure 11E:
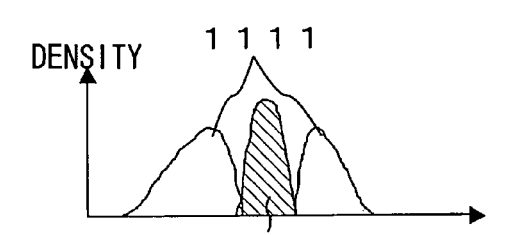
Figure 11F:
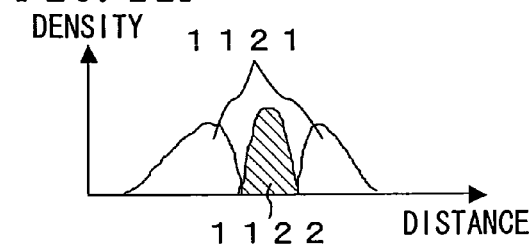
Figure 11G:
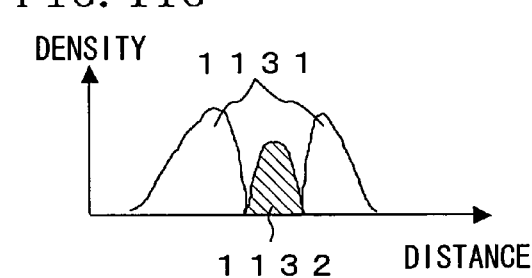
Figure 11H:
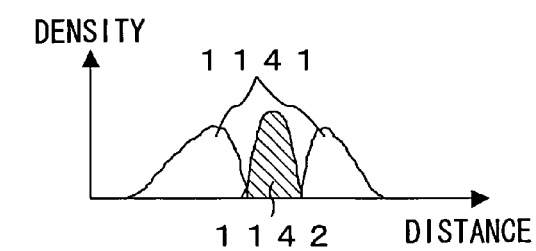
Figure 11I:
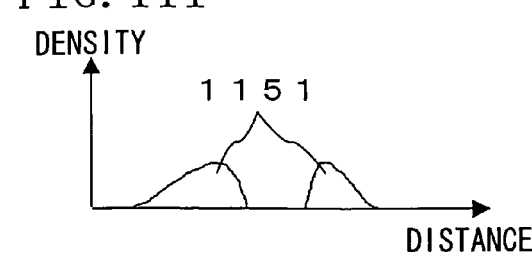

FIG. 11A shows a distribution 1101 of the memory cell threshold voltage observed immediately after the first programming under given conditions. FIG. 11B shows a distribution 1102 of the memory cell threshold voltage observed after the lapse of a fixed time. In FIG. 11B, 1106 represents memory cells targeted for the second programming. FIG. 11C shows a distribution 1103 of the memory cell threshold voltage observed after the second programming executed until reaching a predetermined verify level. FIG. 11D shows a distribution 1104 of the memory cell threshold voltage observed in the last period of life. In FIGS. 11A through 11D, 1105 represents the verify level. FIG. 11E shows a probability density distribution 1111 of electrons and a probability density distribution 1112 of holes, both observed immediately after the first programming under given conditions. FIG. 11F shows a probability density distribution 1121 of electrons and a probability density distribution 1122 of holes, both observed after the lapse of a fixed time. FIG. 11G shows a probability density distribution 1131 of electrons and a probability density distribution 1132 of holes, both observed after the second programming executed until reaching the predetermined verify level. FIG. 11H shows a probability density distribution 1141 of electrons and a probability density distribution 1142 of electrons, both in memory cells for which the second programming has not been executed. FIG. 11I shows a probability density distribution 1151 of electrons observed in the last period of life.

In the state in which two types of charge are locally trapped as described above, in the distribution 1101 of the memory cell threshold voltage observed immediately after the first programming under given conditions, electrons and holes exhibit different probability density distributions from each other. At their overlap portions, electrons and holes are bound together instantaneously, to exhibit the probability density distribution 1111 of electrons and the probability density distribution 1112 of holes as shown in FIG. 11E.

In the distribution 1102 of the memory cell threshold voltage after the lapse of a fixed time, binding between electrons and holes advances due to lateral diffusion of charge. This results in reduction in the numbers of both electrons and holes, to exhibit the probability density distribution 1121 of electrons and the probability density distribution 1122 of holes as shown in FIG. 11F. This causes a change in memory cell threshold voltage, that is, the distribution of the memory cell threshold voltage falls from the distribution 1101. The memory cells 1106 targeted for the second programming are memory cells failing to satisfy the predetermined verify level. Depending on the first programming conditions, the memory cells 1106 targeted for the second programming may include all memory cells.

In the distribution 1103 of the memory cell threshold voltage observed after the second programming executed until reaching the predetermined verify level, electrons are newly injected for the memory cells 1106 targeted for the second programming. This increases the number of electrons while decreasing the number of holes, to exhibit the probability density distribution 1131 of electrons and the probability density distribution 1132 of holes as shown in FIG. 11G. As for memory cells other than the memory cells 1106 targeted for the second programming, the second programming is not executed. Therefore, as shown in FIG. 11H, the probability density distribution 1141 of electrons and the probability density distribution 1142 of holes are respectively unchanged from the probability density distribution 1121 of electrons and the probability density distribution 1122 of electrons shown in FIG. 11F. Thus, while the threshold voltages of the memory cells 1106 targeted for the second programming change, the threshold voltages of the memory cells other than the memory cells 1106 do not change. This narrows the distribution width of the distribution 1103 of the memory cell threshold voltage. Also, since all memory cells are not subjected to the second programming, the programming time can be shortened.

In the distribution 1104 of the memory cell threshold voltage in the last period of life, since the total number of electrons is greater than that of holes in the programming state, holes disappear by binding with electrons, and thus only the probability density distribution 1141 of electrons exists as shown in FIG. 11I. This causes a change in memory cell threshold voltage, that is, the distribution of the memory cell threshold voltage falls from the distribution 1003.

As described above, according to the present invention, in which verify operation is executed in the second programming, it is easily possible to attain a given memory cell threshold voltage. Also, the number of memory cells targeted for the second programming can be changed with selection of the first programming conditions. A smaller number of memory cells targeted for the second programming permits shortening of the programming time, while a larger number of memory cells targeted for the second programming permits compensation of the charge loss due to the initial variation for these memory cells.

Embodiment 6

In Embodiment 6, while the first programming is executed with verify operation, the second programming is executed under given conditions without verify operation.

FIGS. 12A through 12H are views showing a programming or erasing method for a nonvolatile semiconductor memory device in Embodiment 6 of the present invention. Hereinafter, a method adopted when programming is made for a particular nonvolatile memory cell will be described.

FIGS. 12A through 12D show distributions of the memory cell threshold voltage, where the x-axis represents the memory cell threshold voltage and the y-axis represents the number of memory cells targeted for programming. FIGS. 12E through 12H show the probability density distributions in the neighborhood of the first impurity region 1803 in FIG. 19, where the x-axis represents the distance in the direction of arrow x in FIG. 19 and the y-axis represents the charge density.

Figure 12A:
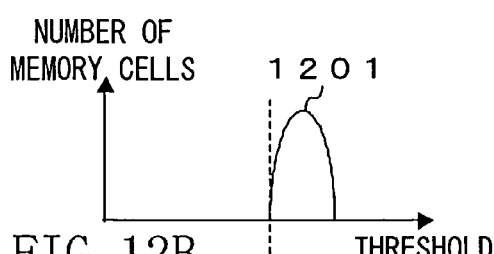
FIGS. 12A through 12H are views showing a programming or erasing method for a nonvolatile semiconductor memory device in Embodiment 6.
Figure 12B:
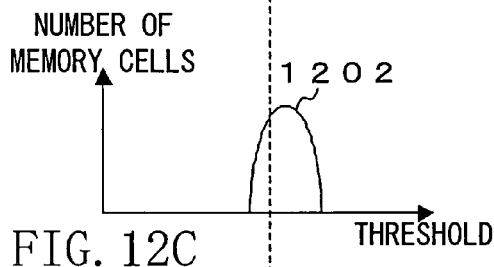
Figure 12C:
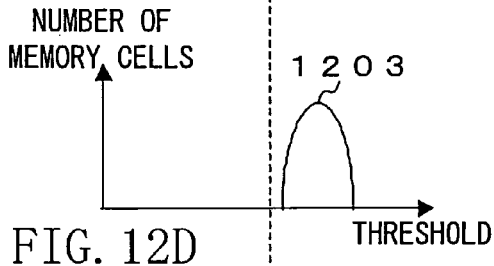
Figure 12D:
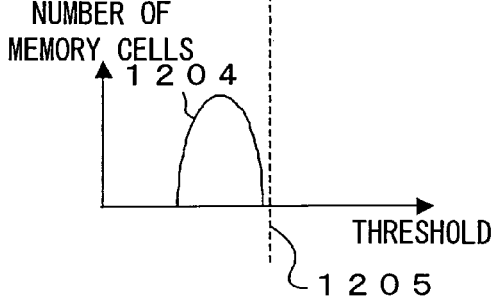
Figure 12E:
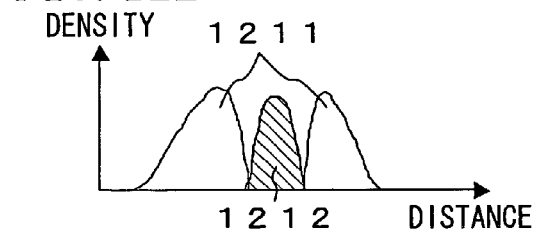
Figure 12F:
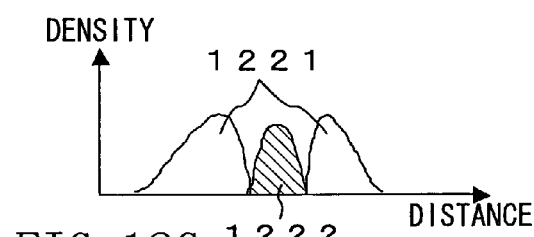
Figure 12G:
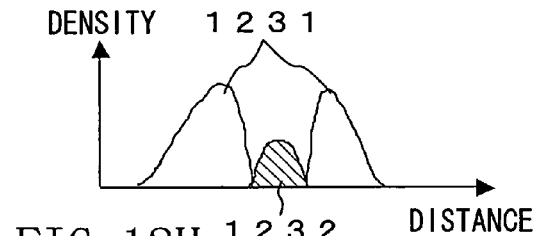
Figure 12H:
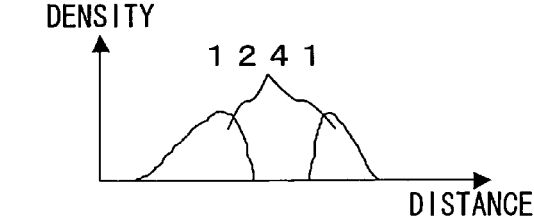

FIG. 12A shows a distribution 1201 of the memory cell threshold voltage observed immediately after the first programming executed until reaching a predetermined verify level. FIG. 12B shows a distribution 1202 of the memory cell threshold voltage observed after the lapse of a fixed time. FIG. 12C shows a distribution 1203 of the memory cell threshold voltage observed after the second programming under given conditions. FIG. 12D shows a distribution 1204 of the memory cell threshold voltage observed in the last period of life. In FIGS. 12A through 12D, 1205 represents the verify level. FIG. 12E shows a probability density distribution 1211 of electrons and a probability density distribution 1212 of holes, both observed immediately after the first programming executed until reaching the predetermined verify level. FIG. 12F shows a probability density distribution 1221 of electrons and a probability density distribution 1222 of holes, both observed after the lapse of a fixed time. FIG. 12G shows a probability density distribution 1231 of electrons and a probability density distribution 1232 of holes, both observed after the second programming under given conditions. FIG. 12H shows a probability density distribution 1241 of electrons of electrons observed in the last period of life.

In the state in which two types of charge are locally trapped as described above, in the distribution 1201 of the memory cell threshold voltage observed immediately after the first programming executed until reaching the predetermined verify level, electrons and holes exhibit different probability density distributions from each other. At their overlap portions, electrons and holes are bound together instantaneously, to exhibit the probability density distribution 1211 of electrons and the probability density distribution 1212 of holes as shown in FIG. 12E.

In the distribution 1202 of the memory cell threshold voltage after the lapse of a fixed time, binding between electrons and holes advances due to lateral diffusion of charge. This results in reduction in the numbers of electrons and holes, to exhibit the probability density distribution 1221 of electrons and the probability density distribution 1222 of holes as shown in FIG. 12F. This causes a change in memory cell threshold voltage, that is, the distribution of the memory cell threshold voltage falls from the distribution 1201.

In the distribution 1203 of the memory cell threshold voltage observed after the second programming under given conditions, in which no verify operation is executed, electrons are newly injected into all memory cells. This increases the number of electrons while decreasing the number of holes, to exhibit the probability density distribution 1231 of electrons and the probability density distribution 1232 of holes as shown in FIG. 12G. This causes a change in memory cell threshold voltage, that is, the distribution of the memory cell threshold voltage rises from the distribution 1202.

In the distribution 1204 of the memory cell threshold voltage in the last period of life, since the number of electrons is greater than that of holes in the programming state, holes disappear by binding with electrons, and thus only the probability density distribution 1241 of electrons exists as shown in FIG. 12H. This causes a change in memory cell threshold voltage, that is, the distribution of the memory cell threshold voltage falls from the distribution 1203.

As described above, according to the present invention, in which verify operation is executed in the first programming, it is easily possible to attain a given memory cell threshold voltage. Since the memory cell threshold voltages of memory cells after the first programming operation can be aligned with the verify level, the effect of improving the data retention characteristic can be consistent for chips having different programming or erasing characteristics. Also, since no verify operation is executed in the second programming, the charge loss due to the initial variation can be compensated for all memory cells.

Embodiment 7

In Embodiment 7, both the first programming and the second programming are executed with verify operation.

FIGS. 13A through 13I are views showing a programming or erasing method for a nonvolatile semiconductor memory device in Embodiment 7 of the present invention. Hereinafter, a method adopted when programming is made for a particular nonvolatile memory cell will be described.

FIGS. 13A through 13D show distributions of the memory cell threshold voltage, where the x-axis represents the memory cell threshold voltage and the y-axis represents the number of memory cells targeted for programming. FIGS. 13E through 13I show the probability density distributions in the neighborhood of the first impurity region 1803 in FIG. 19, where the x-axis represents the distance in the direction of arrow x in FIG. 19 and the y-axis represents the charge density.

FIG. 13A shows a distribution 1301 of the memory cell threshold voltage observed immediately after the first programming executed until reaching a predetermined verify level. FIG. 13B shows a distribution 1302 of the memory cell threshold voltage observed after the lapse of a fixed time. In FIG. 13B, 1306 represents memory cells targeted for the second programming. FIG. 13C shows a distribution 1303 of the memory cell threshold voltage observed after the second programming executed until reaching the predetermined verify level. FIG. 13D shows a distribution 1304 of the memory cell threshold voltage observed in the last period of life. In FIGS. 13A through 13D, 1305 represents the verify level. FIG. 13E shows a probability density distribution 1311 of electrons and a probability density distribution 1312 of holes, both observed immediately after the first programming executed until reaching the predetermined verify level. FIG. 13F shows a probability density distribution 1321 of electrons and a probability density distribution 1322 of holes, both observed after the lapse of a fixed time. FIG. 13G shows a probability density distribution 1331 of electrons and a probability density distribution 1332 of holes, both observed after the second programming executed until reaching the predetermined verify level. FIG. 13H shows a probability density distribution 1341 of electrons and a probability density distribution 1342 of electrons, both in memory cells for which the second programming has not been executed. FIG. 13I shows a probability density distribution 1351 of electrons observed in the last period of life.

In the state in which two types of charge are locally trapped as described above, in the distribution 1301 of the memory cell threshold voltage observed immediately after the first programming executed until reaching the predetermined verify level, electrons and holes exhibit different probability density distributions from each other. At their overlap portions, electrons and holes are bound together instantaneously, to exhibit the probability density distribution 1311 of electrons and the probability density distribution 1312 of holes as shown in FIG. 13E.

In the distribution 1302 of the memory cell threshold voltage after the lapse of a fixed time, binding between electrons and holes advances due to lateral diffusion of charge. This results in reduction in the numbers of both electrons and holes, to exhibit the probability density distribution 1321 of electrons and the probability density distribution 1322 of holes as shown in FIG. 13F. This causes a change in memory cell threshold voltage, that is, the distribution of the memory cell threshold voltage falls from the distribution 1301. The memory cells 1306 targeted for the second programming are memory cells failing to satisfy the predetermined verify level.

In the distribution 1303 of the memory cell threshold voltage observed after the second programming executed until reaching the predetermined verify level, electrons are newly injected for the memory cells 1306 targeted for the second programming. This increases the number of electrons while decreasing the number of holes, to exhibit the probability density distribution 1331 of electrons and the probability density distribution 1332 of holes as shown in FIG. 13G. As for memory cells other than the memory cells 1306 targeted for the second programming, the second programming is not executed. Therefore, as shown in FIG. 13H, the probability density distribution 1341 of electrons and the probability density distribution 1342 of holes are respectively unchanged from the probability density distribution 1321 of electrons and the probability density distribution 1322 of holes shown in FIG. 13F. As a result, while the threshold voltages of the memory cells 1306 targeted for the second programming change, the threshold voltages of the memory cells other than the memory cells 1306 do not change. This narrows the distribution width of the distribution 1303 of the memory cell threshold voltage. Also, since all memory cells are not subjected to the second programming, the programming time can be shortened.

In the distribution 1304 of the memory cell threshold voltage in the last period of life, since the total number of electrons is greater than that of holes in the programming state, holes disappear by binding with electrons, and thus only the probability density distribution 1351 of electrons exists as shown in FIG. 13I. This causes a change in memory cell threshold voltage, that is, the distribution of the memory cell threshold voltage falls from the distribution 1303.

As described above, according to the present invention, in which verify operation is executed in both the first programming and the second programming, it is easily possible to attain a given memory cell threshold voltage. Since the memory cell threshold voltages of memory cells after the first programming operation can be aligned with the verify level, the effect of improving the data retention characteristic can be consistent for chips having different programming or erasing characteristics. Also, since all memory cells are not subjected to the second programming, the programming time can be shortened.

Embodiment 8

In Embodiment 8, verify operation is executed for both the first programming and the second programming, and a difference is given between a first verify level and a second verify level.

FIGS. 14A through 14I are views showing a programming or erasing method for a nonvolatile semiconductor memory device in Embodiment 8 of the present invention. Hereinafter, a method adopted when programming is made for a particular nonvolatile memory cell will be described.

FIGS. 14A through 14D show distributions of the memory cell threshold voltage, where the x-axis represents the memory cell threshold voltage and the y-axis represents the number of memory cells targeted for programming. FIGS. 14E through 14I show the probability density distributions in the neighborhood of the first impurity region 1803 in FIG. 19, where the x-axis represents the distance in the direction of arrow x in FIG. 19 and the y-axis represents the charge density.

Figure 14A:
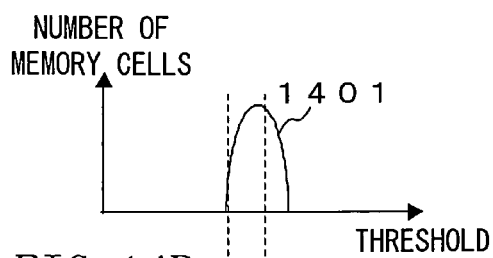
FIGS. 14A through 14I are views showing a programming or erasing method for a nonvolatile semiconductor memory device in Embodiment 8.
Figure 14E:
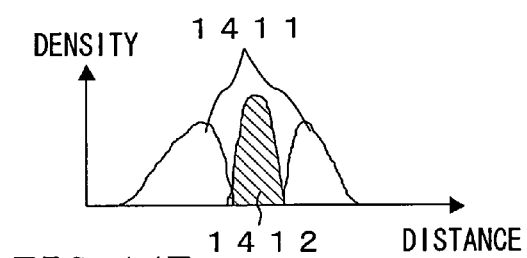
Figure 14B:
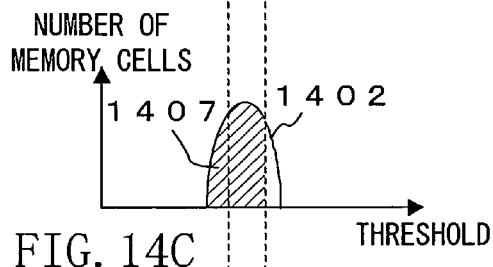
Figure 14F:
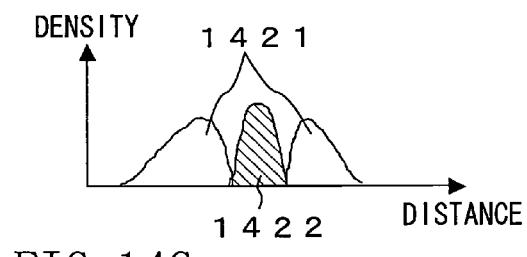
Figure 14C:
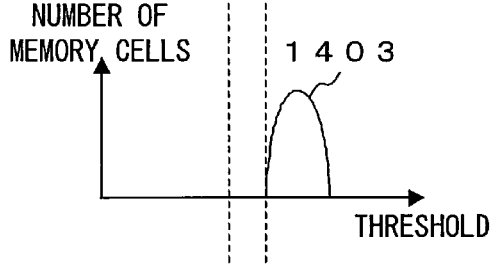
Figure 14G:
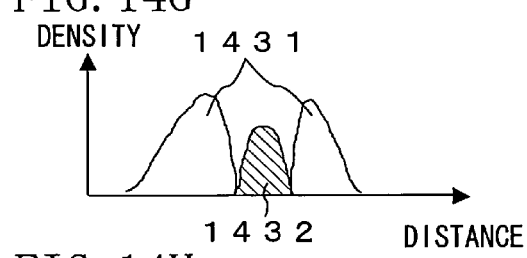
Figure 14D:
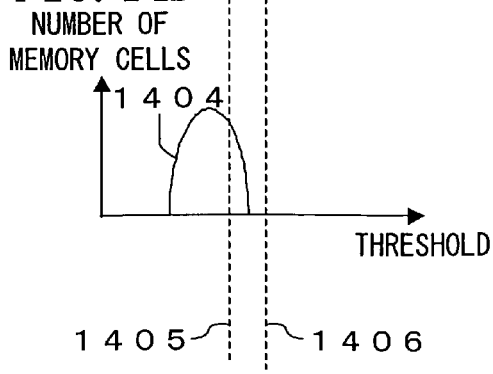
Figure 14H:
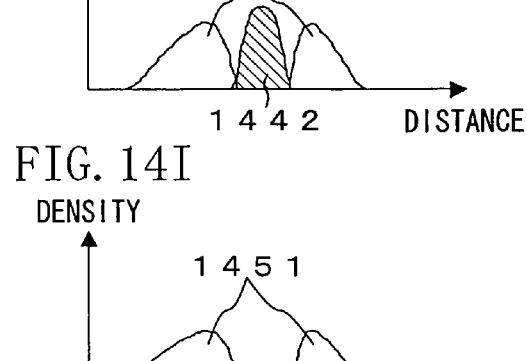
Figure 14I:
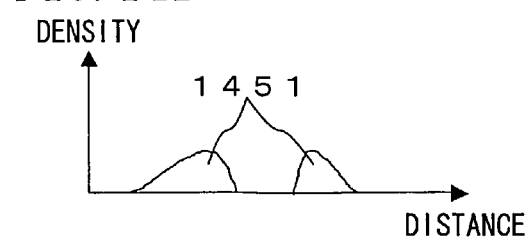

FIG. 14A shows a distribution 1401 of the memory cell threshold voltage observed immediately after the first programming executed until reaching the first verify level. FIG. 14B shows a distribution 1402 of the memory cell threshold voltage observed after the lapse of a fixed time. In FIG. 14B, 1407 represents memory cells targeted for the second programming. FIG. 14C shows a distribution 1403 of the memory cell threshold voltage observed after the second programming executed until reaching the second verify level. FIG. 14D shows a distribution 1404 of the memory cell threshold voltage observed in the last period of life. In FIGS. 14A through 14D, 1405 and 1406 respectively represent the first and second verify levels. FIG. 14E shows a probability density distribution 1411 of electrons and a probability density distribution 1412 of holes, both observed immediately after the first programming executed until reaching the first verify level. FIG. 14F shows a probability density distribution 1421 of electrons and a probability density distribution 1422 of holes, both observed after the lapse of a fixed time. FIG. 14G shows a probability density distribution 1431 of electrons and a probability density distribution 1432 of holes, both observed after the second programming executed until reaching the second verify level. FIG. 14H shows a probability density distribution 1441 of electrons and a probability density distribution 1442 of electrons, both in memory cells for which the second programming has not been executed. FIG. 14I shows a probability density distribution 1451 of electrons observed in the last period of life.

In the state in which two types of charge are locally trapped as described above, in the distribution 1401 of the memory cell threshold voltage observed immediately after the first programming executed until reaching the first verify level, electrons and holes exhibit different probability density distributions from each other. At their overlap portions, electrons and holes are bound together instantaneously, to exhibit the probability density distribution 1411 of electrons and the probability density distribution 1412 of holes as shown in FIG. 14E.

In the distribution 1402 of the memory cell threshold voltage after the lapse of a fixed time, binding between electrons and holes advances due to lateral diffusion of charge. This results in reduction in the numbers of both electrons and holes, to exhibit the probability density distribution 1421 of electrons and the probability density distribution 1422 of holes as shown in FIG. 14F. This causes a change in memory cell threshold voltage, that is, the distribution of the memory cell threshold voltage falls from the distribution 1401. The memory cells 1407 targeted for the second programming are memory cells failing to satisfy the second verify level. Depending on the setting of the first verify level, the memory cells 1407 targeted for the second programming may include all memory cells.

In the distribution 1403 of the memory cell threshold voltage observed after the second programming executed until reaching the second verify level, electrons are newly injected for the memory cells 1407 targeted for the second programming. This increases the number of electrons while decreasing the number of holes, to exhibit the probability density distribution 1431 of electrons and the probability density distribution 1432 of holes as shown in FIG. 14G. As for memory cells other than the memory cells 1407 targeted for the second programming, the second programming is not executed. Therefore, as shown in FIG. 14H, the probability density distribution 1441 of electrons and the probability density distribution 1442 of holes are respectively unchanged from the probability density distribution 1421 of electrons and the probability density distribution 1422 of holes shown in FIG. 14F. As a result, while the threshold voltages of the memory cells 1407 targeted for the second programming change, the threshold voltages of the memory cells other than the memory cells 1407 do not change. This narrows the distribution width of the distribution 1403 of the memory cell threshold voltage. Also, since all memory cells are not subjected to the second programming, the programming time can be shortened.

In the distribution 1404 of the memory cell threshold voltage in the last period of life, since the total number of electrons is greater than that of holes in the programming state, holes disappear by binding with electrons, and thus only the probability density distribution 1451 of electrons exists as shown in FIG. 14I. This causes a change in memory cell threshold voltage, that is, the distribution of the memory cell threshold voltage falls from the distribution 1403.

As described above, according to the present invention, in which verify operation is executed in both the first programming and the second programming, it is easily possible to attain a given memory cell threshold voltage. Since the memory cell threshold voltages of memory cells after the first programming operation can be aligned with the first verify level, the effect of improving the data retention characteristic can be consistent for chips having different programming or erasing characteristics. Also, since there are given the first and second verify levels different from each other, the number of memory cells targeted for the second programming can be changed with the setting of these verify levels. A smaller number of memory cells targeted for the second programming permits shortening of the programming time, while a larger number of memory cells targeted for the second programming permits compensation of the charge loss due to the initial variation for these memory cells.

The number of memory cells targeted for the second programming can also be changed, in Embodiment 5, with selection of the first programming conditions. In this case, however, a large variation occurs among chips having different programming or erasing characteristics. In Embodiment 8, since the memory cell threshold voltage observed after the first programming operation can be aligned with the first verify level, the variation among chips having different programming or erasing characteristics can be minimized.

Embodiment 9

Figure 15:
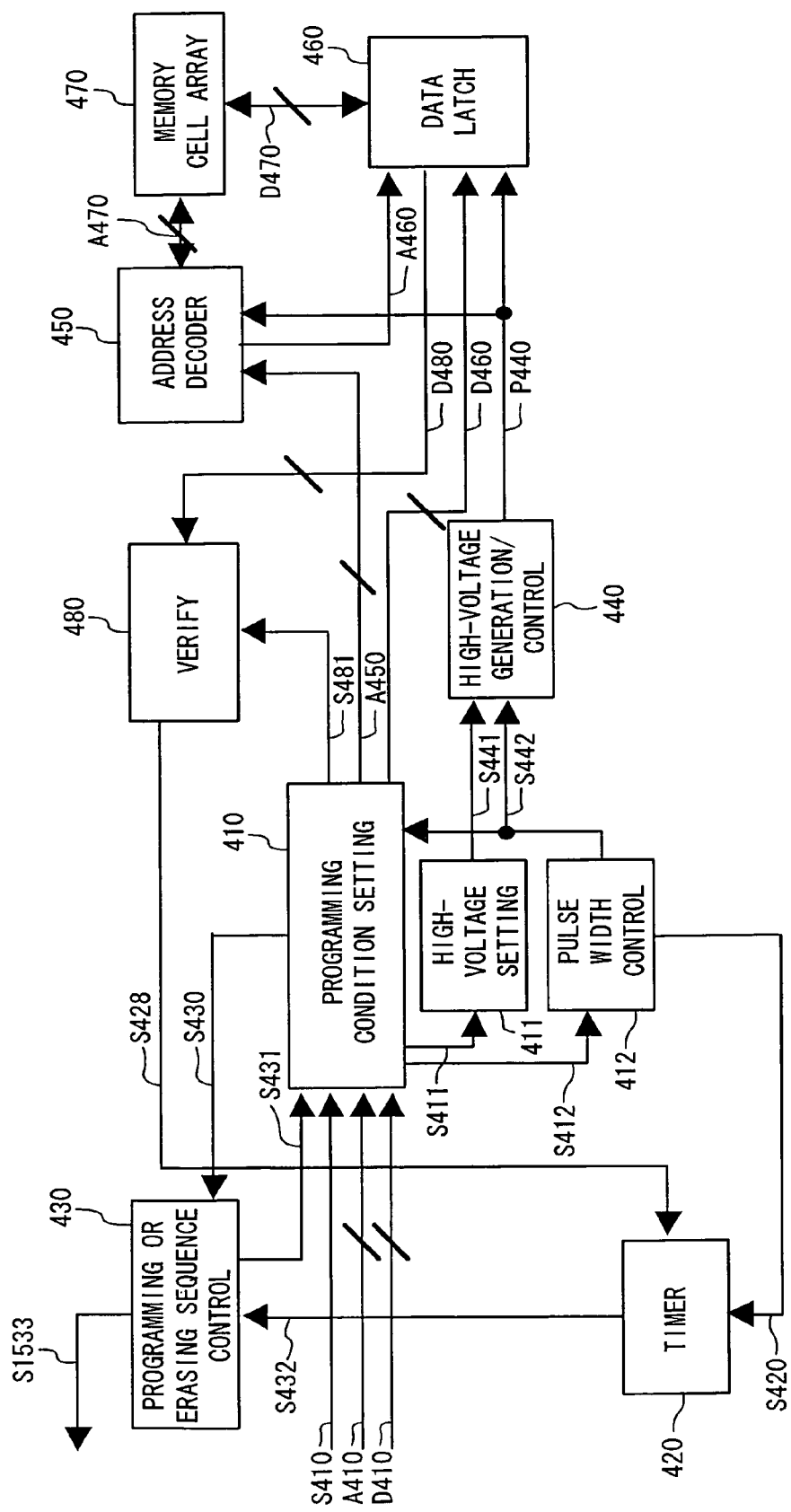
FIG. 15 is a view showing a circuit configuration of a nonvolatile semiconductor memory device in Embodiment 9.
Figure 16:
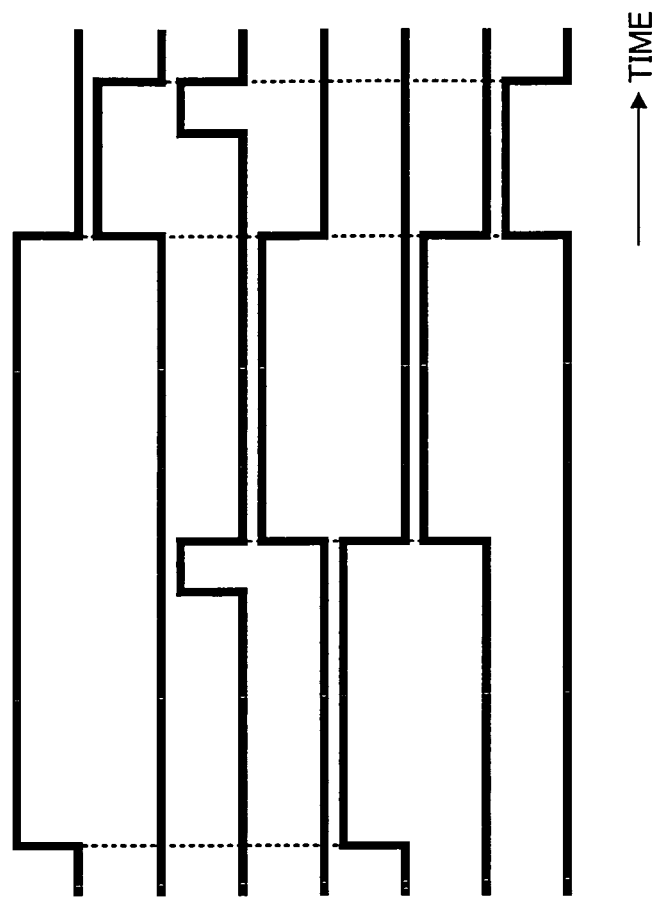
FIG. 16 is a view showing the operation timing of the nonvolatile semiconductor memory device in Embodiment 9.

FIG. 15 shows a nonvolatile semiconductor memory device in Embodiment 9 of the present invention, which has the same configuration as that in FIG. 5 except that the programming or erasing sequence control circuit 430 outputs a BUSY signal S1533. In this embodiment, the BUSY signal S1533 is output according to the timing chart of FIG. 16.

During application of a first programming pulse, the programming or erasing sequence control circuit 430 receives P1 (indicating that the first programming operation is underway) of the control signal S430 and an inverted signal of WAIT (indicating that a fixed wait time after the first programming is underway) of the control signal S432. The programming or erasing sequence control circuit 430 then outputs AND of these two input signals as BUSY1P (indicating that the first programming pulse is being applied) of the BUSY signal S1533.

During a fixed wait time after the application of the first programming pulse, the programming or erasing sequence control circuit 430 receives P1 of the control signal S430 and WAIT of the control signal S432. The programming or erasing sequence control circuit 430 then outputs AND of these two input signals as BUSY1W (indicating that a fixed wait time after application of the first programming pulse is underway) of the BUSY signal S1533.

During application of a second programming pulse, the programming or erasing sequence control circuit 430 receives P2 (indicating that the second programming operation is underway) of the control signal S430 and the inverted signal of WAIT of the control signal S432. The programming or erasing sequence control circuit 430 then outputs AND of these two input signals as BUSY2 (indicating that the second programming pulse is being applied) of the BUSY signal S1533.

Alternatively, since P1 (indicating that the first programming operation is underway) of the control signal S430 is input into the programming or erasing sequence control circuit 430 during the first programming operation, this signal may be used as BYSY1 (indicating that the first programming operation is underway) of the BUSY signal S1533.

As described above, according to the present invention, by generating a signal that is ON during execution of the first charge injection or the second charge injection, it is possible to indicate that the memory cell concerned is under execution of the first charge injection or the second charge injection, to prohibit access to the memory cell. It is also possible to make effective use of the wait time, to shorten the programming time.

Embodiment 10

Figure 17:
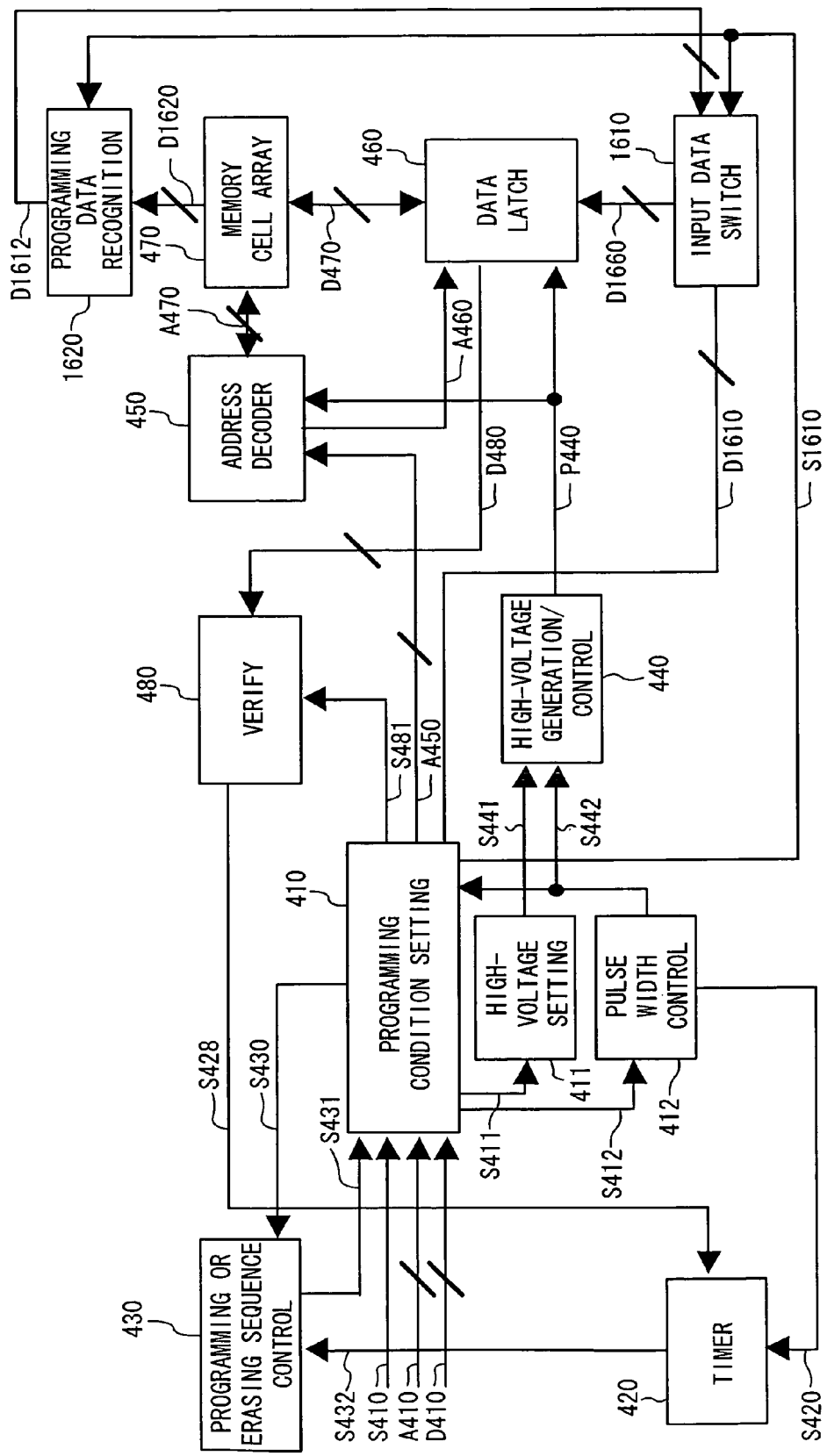
FIG. 17 is a view showing a circuit configuration of a nonvolatile semiconductor memory device in Embodiment 10.

FIG. 17 shows a nonvolatile semiconductor memory device in Embodiment 10 of the present invention, which has the same configuration as that in FIG. 5 except for the followings. That is, an input data switch circuit 1610 and a programming data determination circuit 1620 are additionally provided, and the data bus D460 is deleted. Data buses D1610 and D1612 are input to the input data switch circuit 1610 from the programming condition setting circuit 410 and the programming data determination circuit 1620, respectively. A data bus D1660 is output from the input data switch circuit 1610 to be input to the data latch circuit 460. A data bus D1620 is output from the memory cell array 470 to be input to the programming data determination circuit 1620. A control signal S1610 is output from the programming condition setting circuit 410 to be input into the input data switch circuit 1610 and the programming data determination circuit 1620.

First, the first programming operation will be described. Programming data for a predetermined address (address m) input into the programming condition setting circuit 410 via the data bus D410 is then input into the input data switch circuit 1610 via the data bus D1610. During this input, the input data switch circuit 1610 does not accept input data via the data bus D1612. The data input via D1610 is then transferred to the data latch circuit 460 to be programmed at the predetermined address (address m) in the memory cell array 470 under the first programming operation.

As for an address (address n) different from the predetermined address (address m), also, programming data for this address is transferred through D410→410→D1610→1610→D1660→460, as was done for the predetermined address described above, to perform programming under the first programming operation.

The second programming operation will then be described. For example, data programmed at the address m is recognized by the programming data recognition circuit 1620 connected to the memory cell array 470 via the data bus D1620, and the recognized data is input into the input data switch circuit 1610 via the data bus D1612. During this input, no input data from the data bus D1610 is accepted. The data input via D1612 is then transferred to the data latch circuit 460 to be programmed at the predetermined address (address m) in the memory cell array 470 under the second programming operation.

As was done for the address m, data programmed at the address n is also subjected to programming data recognition and transfer through 470→D1620→1620→D1612→1610→D1660→460, to be programmed at the address n under the second programming operation.

As described above, according to the present invention, the necessity of re-input of programming data during the second charge injection can be omitted.

Embodiment 11

Figure 18:
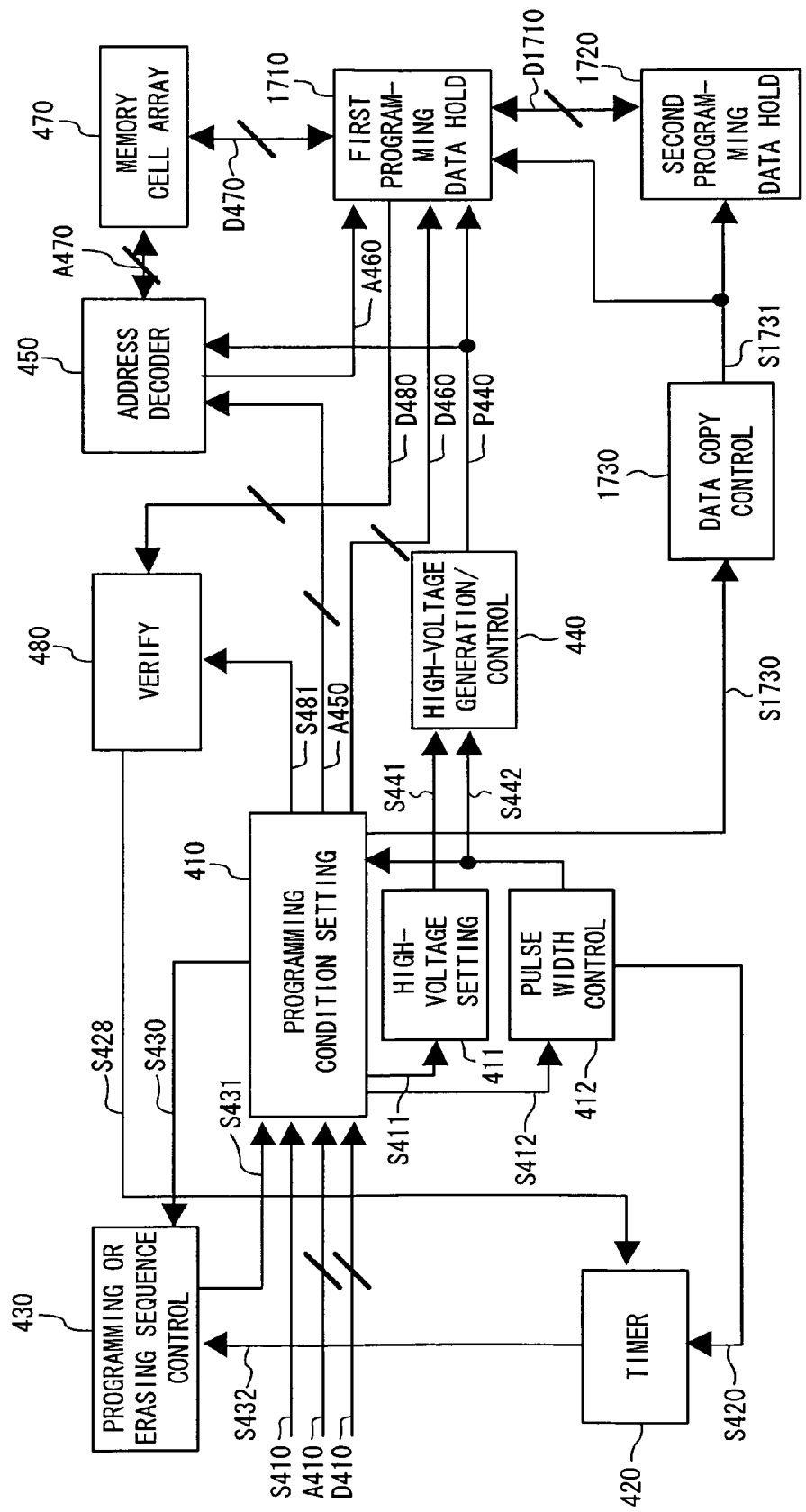
FIG. 18 is a view showing a circuit configuration of a nonvolatile semiconductor memory device in Embodiment 11.

FIG. 18 shows a nonvolatile semiconductor memory device in Embodiment 11 of the present invention, which has the same configuration as that in FIG. 5 except for the followings. That is, the data latch circuit 460 is replaced with a first programming data hold circuit 1710. A second programming data hold circuit 1720 and a data copy control circuit 1730 are additionally provided. The first programming data hold circuit 1710 and the second programming data hold circuit 1720 are connected to each other via a bidirectional data bus D1710. A control signal S1730 is output from the programming condition setting circuit 410 to be input into the data copy control circuit 1730. A control signal S1731 is output from the data copy control circuit 1730 to be input into both the first programming data hold circuit 1710 and the second programming data hold circuit 1720. Assume herein that the second programming data hold circuit 1720 has a capacity greater than the first programming data hold circuit 1710.

First, the first programming operation will be described. Programming data for a predetermined address (address p) input into the first programming data hold circuit 1710 via the data bus D460 is programmed at the address p in the memory cell array 470 and also transferred to and held in the second programming data hold circuit 1720 together with address information, under control of the data copy control circuit 1730. As the second programming data hold circuit 1720, a nonvolatile memory such as SRAM, for example, may be used.

The first programming operation for an address (address q) different from the predetermined address is as follows. As was done for the predetermined address (address p), programming data is programmed at the address q in the memory cell array 470, and also transferred to and held in the second programming data hold circuit 1720 together with address information. Note that the address information and programming data for the address q should be held in a region not overlapping the region for the address p in the second programming data hold circuit 1720.

The second programming operation will then be described. For example, the programming data together with the address information for the address p is transferred from the second programming data hold circuit 1720 to the first programming data hold circuit 1710 under control of the data copy control circuit 1730, to be programmed at the address p in the memory cell array 470.

As for the second programming for the address q, also, the programming data together with address information is transferred and programmed at the address q as was done for the address p.

Thus, according to the present invention, the necessity of re-input of programming data at the second charge injection is omitted, and thus by using a nonvolatile memory such as SRAM as the second programming data hold circuit 1720, the programming time can be shortened.

As described above, the present invention can improve the data retention characteristic of memory cells, and thus is useful as a nonvolatile memory having a trap layer.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A programming or erasing method for a nonvolatile semiconductor memory device having a trap layer, the method comprising, during programming or erasing, a first charge injection step and a second charge injection step executed after the first charge injection step,
   wherein in the first charge injection step, a given wait time is secured after charge injection is executed until reaching a given threshold voltage,
   in the second charge injection step, charge injection is executed until reaching a given threshold voltage, and
   the wait time is longer than the time required for a normal verify operation or read operation.

2. A programming or erasing method for a nonvolatile semiconductor memory device having a trap layer, the method comprising, during programming or erasing, a first charge injection step and a second charge injection step executed after the first charge injection step,
   wherein in the first charge injection step, a given wait time is secured after charge injection is executed until reaching a given threshold voltage,
   in the second charge injection step, charge injection is executed until reaching a given threshold voltage, and
   the wait time is the time required for binding of first charge trapped in the first charge injection step with surrounding charge opposite to the first charge already trapped before the first charge injection step.

3. A programming or erasing method for a nonvolatile semiconductor memory device having a trap layer, the method comprising, during programming or erasing, a first charge injection step and a second charge injection step executed after the first charge injection step,
   wherein in the first charge injection step, a given wait time is secured after charge injection is executed until reaching a given threshold voltage,
   in the second charge injection step, charge injection is executed until reaching a given threshold voltage, and
   as the wait time, the time of operation other than the second charge injection step for the memory cell for which the first charge injection has been executed is utilized.

4. A programming or erasing method for a nonvolatile semiconductor memory device having a trap layer, the method comprising, during programming or erasing, a first charge injection step and a second charge injection step executed after the first charge injection step,
   wherein in the first charge injection step, a given wait time is secured after charge injection is executed until reaching a given threshold voltage,
   in the second charge injection step, charge injection is executed until reaching a given threshold voltage, and
   the wait time can be set with a timer circuit so that a fixed time or longer is maintained for a memory cell targeted for programming or erasing.

5. A programming or erasing method for a nonvolatile semiconductor memory device having a trap layer, the method comprising, during programming or erasing, a first charge injection step and a second charge injection step executed after the first charge injection step,
   wherein in the first charge injection step, a given wait time is secured after charge injection is executed until reaching a given threshold voltage,
   in the second charge injection step, charge injection is executed until reaching a given threshold voltage, and
   two different verify levels are provided, and assuming that one having a lower threshold voltage is called the first verify level and the other having a higher threshold voltage is called the second verify level, the first charge injection step is executed until reaching the first verify level, and the second charge injection step is executed until reaching the second verify level.

6. A programming or erasing method for a nonvolatile semiconductor memory device having a trap layer, the method comprising, during programming or erasing, a first charge injection step and a second charge injection step executed after the first charge injection step,
   wherein in the first charge injection step, a given wait time is secured after charge injection is executed until reaching a given threshold voltage,
   in the second charge injection step, charge injection is executed until reaching a given threshold voltage, and
   two different verify levels are provided, and assuming that one having a lower threshold voltage is called the first verify level and the other having a higher threshold voltage is called the second verify level, the first charge injection step is executed until reaching the second verify level, and the second charge injection step is executed until reaching the first verify level.

7. A nonvolatile semiconductor memory device having a trap layer, the device comprising:
   a programming or erasing sequence control circuit for controlling, so that first charge injection and second charge injection are executed during programming or erasing, a given wait time after charge injection is executed until reaching a given memory cell threshold voltage in the first charge injection and also controlling the second charge injection after the lapse of the given wait time;
   a programming data recognition circuit for recognizing data programmed in the first charge injection; and
   an input data switch circuit capable of switching between the data recognized by the programming data recognition circuit and programming data input externally.

8. A nonvolatile semiconductor memory device having a trap layer, the device comprising:
   a programming or erasing sequence control circuit for controlling, so that first charge injection and second charge injection are executed during programming or erasing, a given wait time after charge injection is executed until reaching a given memory cell threshold voltage in the first charge injection and also controlling the second charge injection after the lapse of the given wait time;
   a first programming data hold circuit capable of holding data;
   a second programming data hold circuit capable of holding data and copying data bidirectionally with the first programming data hold circuit, the second programming data hold circuit having a capacity greater than the first programming data hold circuit; and
   a data copying control circuit for controlling data transfer between the first programming data hold circuit and the second programming data hold circuit.

* * * * *